(12) United States Patent
Padmanabhan et al.

(10) Patent No.: US 9,905,500 B2
(45) Date of Patent: Feb. 27, 2018

(54) SEMICONDUCTOR COMPONENT AND METHOD OF MANUFACTURE

(71) Applicant: Semiconductor Components Industries, LLC, Phoenix, AZ (US)

(72) Inventors: Balaji Padmanabhan, Tempe, AZ (US); Prasad Venkatraman, Gilbert, AZ (US); Ali Salih, Mesa, AZ (US); Mihir Mudholkar, Tempe, AZ (US); Chun-Li Liu, Scottsdale, AZ (US); Jason McDonald, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/202,826

(22) Filed: Jul. 6, 2016

(65) Prior Publication Data

US 2017/0025336 A1 Jan. 26, 2017

Related U.S. Application Data

(60) Provisional application No. 62/196,636, filed on Jul. 24, 2015.

(51) Int. Cl.
*H01L 23/00* (2006.01)
*H01L 23/495* (2006.01)

(52) U.S. Cl.
CPC .... *H01L 23/49575* (2013.01); *H01L 23/4951* (2013.01); *H01L 23/49524* (2013.01); *H01L 23/49534* (2013.01); *H01L 23/49558* (2013.01); *H01L 23/49562* (2013.01); *H01L 24/40* (2013.01); *H01L 24/41* (2013.01); *H01L 24/45* (2013.01); *H01L 2224/40105* (2013.01); *H01L 2224/40139* (2013.01); *H01L 2224/40245* (2013.01); *H01L 2224/41109* (2013.01); *H01L 2224/41112* (2013.01); *H01L 2224/41174* (2013.01); *H01L 2224/48245* (2013.01);

(Continued)

(58) Field of Classification Search
CPC .................................. H01L 23/49575
See application file for complete search history.

(56) References Cited

U.S. PATENT DOCUMENTS 7,745,913 B2 6/2010 Hosseini et al.
8,455,987 B1 6/2013 Spann et al.
(Continued)

*Primary Examiner* — William Harriston
(74) *Attorney, Agent, or Firm* — Rennie William Dover

(57) ABSTRACT

In accordance with an embodiment, a semiconductor component includes a support having a first device receiving structure and a second device receiving structure and a contact extension that is common to the first and second device receiving structures. The first device receiving structure includes a device receiving area and the second device receiving structure includes a drain contact area. A III-N based semiconductor chip has a drain bond pad bonded to the drain contact area and a source bond pad bonded to the contact extension and a gate bond pad bonded to an interconnect. A portion of the silicon based semiconductor chip is bonded to the support device receiving area. In accordance with another embodiment, a method for manufacturing the semiconductor component includes coupling a III-N based semiconductor chip to a portion of the support a silicon based semiconductor chip to another portion of the support.

20 Claims, 22 Drawing Sheets

(52) U.S. Cl.
CPC ............... *H01L 2924/1033* (2013.01); *H01L 2924/10253* (2013.01); *H01L 2924/13064* (2013.01); *H01L 2924/13091* (2013.01)

(56) References Cited

U.S. PATENT DOCUMENTS

| | | |
|---|---|---|
| 2007/0249092 A1 | 10/2007 | Joshi et al. |
| 2008/0164590 A1 | 7/2008 | Xiaochun et al. |
| 2010/0232131 A1 | 9/2010 | Qian et al. |
| 2011/0133251 A1 | 6/2011 | He |
| 2012/0223321 A1 | 9/2012 | Lin et al. |
| 2012/0223322 A1 | 9/2012 | Lin et al. |
| 2013/0069208 A1 | 3/2013 | Briere |
| 2013/0088280 A1 | 3/2013 | Lal et al. |
| 2013/0175704 A1 | 7/2013 | Jeun |
| 2013/0256856 A1 | 10/2013 | Mahler et al. |
| 2014/0103510 A1 | 4/2014 | Andou |
| 2014/0197525 A1 | 7/2014 | Kadoguchi |
| 2014/0239472 A1 | 8/2014 | Jones et al. |
| 2014/0361419 A1 | 12/2014 | Xue et al. |
| 2015/0145112 A1 | 5/2015 | Otremba |
| 2016/0211246 A1 | 7/2016 | Akiyama et al. |
| 2016/0247792 A1 * | 8/2016 | Chang ............... H01L 23/49562 |

* cited by examiner

SEMICONDUCTOR COMPONENT AND METHOD OF MANUFACTURE

The present application is a nonprovisional application of Provisional Patent Application No. 62/196,636 filed on Jul. 24, 2015, by Balaji Padmanabhan et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT, cascoded with a silicon device. Using this combination of materials helps achieve a normally-off state using a III-N depletion mode device that is normally-on. Cascoded semiconductor devices have been described in U.S. Patent Application Publication Number 2013/0088280 A1 by Rakesh K. Lal et al. and published on Apr. 11, 2013.

For cascoded devices manufactured from different semiconductor substrate materials, semiconductor component manufacturers typically protect the silicon device and the depletion mode device in separate packages and connect the devices in the separate packages together via leadframe leads to form the cascoded device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device in a single package. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
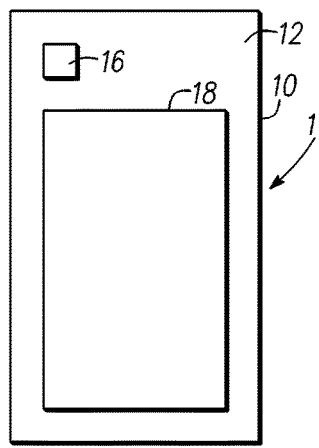
FIG. 1 is a top view of a semiconductor chip suitable for use in manufacturing a cascode configured semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

FIG. 1 is a top view of a semiconductor chip 10 suitable for use in manufacturing a semiconductor component in accordance with an embodiment of the present invention. Semiconductor chip 10 has a top surface 12 and a bottom surface 14 (shown in at least FIGS. 8-10). In accordance with an embodiment, semiconductor chip 10 is a silicon chip that may include a vertical field effect semiconductor device 11 having a gate bond pad 16 formed on or from surface 12, a source bond pad 18 formed on or from surface 12, and a drain electrode 20 (shown in FIGS. 8-10) formed on or from surface 14. It should be noted that semiconductor device 11 is not limited to being a vertical field effect transistor or a field effect transistor. For example, semiconductor device 11 may be an insulated gate bipolar transistor, a bipolar transistor, a junction field effect transistor, a diode, or the like. By way of example, semiconductor chip 10 is a silicon semiconductor chip, i.e., the substrate material of silicon semiconductor chip 10 comprises silicon. A silicon semiconductor material may be referred to as a silicon based semiconductor material, a silicon semiconductor material, or the like. A semiconductor chip such as, for example semiconductor chip 10, may be referred to as a semiconductor die.

Figure 2:
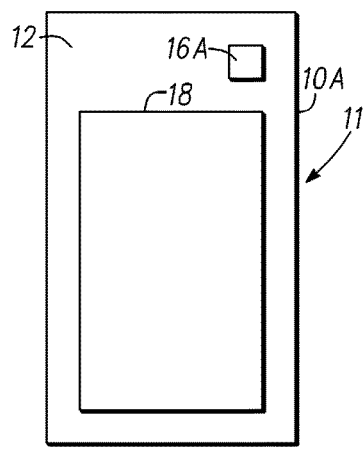
FIG. 2 is a top view of a semiconductor chip suitable for use in manufacturing a cascode configured semiconductor component in accordance with an embodiment of the present invention.

FIG. 2 is a top view of a semiconductor chip 10A suitable for use in manufacturing a semiconductor component in accordance with an embodiment of the present invention. Semiconductor chip 10A has a top surface 12 and a bottom surface 14 (shown in at least FIGS. 22-24). In accordance with an embodiment, semiconductor chip 10A is a silicon chip that may include a vertical field effect semiconductor device 11 having a gate bond pad 16A formed on or from surface 12, a source bond pad 18 formed on or from surface 14, and a drain electrode 20 (shown in FIGS. 20-24) formed on or from surface 14. It should be noted that semiconductor device 11 is not limited to being a vertical field effect transistor or a field effect transistor. For example, semiconductor device 11 may be an insulated gate bipolar transistor, a bipolar transistor, a junction field effect transistor, a diode, or the like. By way of example, semiconductor chip 10A is a silicon semiconductor chip, i.e., the substrate material of silicon semiconductor chip 10A, comprises silicon. A silicon semiconductor material may be referred to as a silicon based semiconductor material, a silicon semiconductor material, or the like. A semiconductor chip such as, for example, semiconductor chip 10A may be referred to as a semiconductor die.

Figure 3:
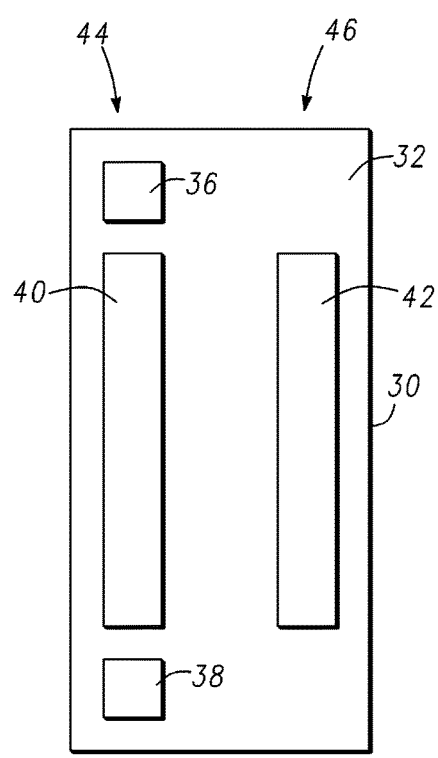
FIG. 3 is a top view of a semiconductor chip suitable for use in manufacturing a cascode configured semiconductor component in accordance with an embodiment of the present invention.

FIG. 3 is a top view of a semiconductor chip 30 suitable for use in manufacturing a semiconductor component in accordance with another embodiment of the present invention. Semiconductor chip 30 has a top surface 32 and a bottom surface 34 (shown in FIGS. 8-10), wherein gate bond pads 36 and 38 are formed on or from top surface 32, a source bond pad 40 is formed on or from top surface 32, and a drain bond pad 42 (shown in FIGS. 8-10) is formed on or from top surface 32. Source bond pad 40 is formed between gate bond pads 36 and 38 and on a side 44 of semiconductor chip 30 whereas drain bond pad 42 is formed on a side 46 of semiconductor chip 30. Sides 42 and 46 are on opposite sides of semiconductor chip 30. It should be noted that gate bond pads 36 and 38 may be electrically connected together through the substrate material of semiconductor chip 30 or through a metallization system or a metal layer formed above top surface 32. Semiconductor chip 30 is fabricated from a compound semiconductor material such as, for example, a III-nitride semiconductor material. Thus, semiconductor chip 30 may be referred to as a III-nitride semiconductor chip, i.e., the substrate material of III-nitride semiconductor chip 30 comprises a III-nitride material such as, for example, aluminum nitride. A III-nitride semiconductor material may be referred to as a III-N semiconductor material, a III-nitride based semiconductor material, a III-N based semiconductor material, or the like. A semiconductor chip such as, for example, semiconductor chip 30 may be referred to as a semiconductor die.

Figure 4:
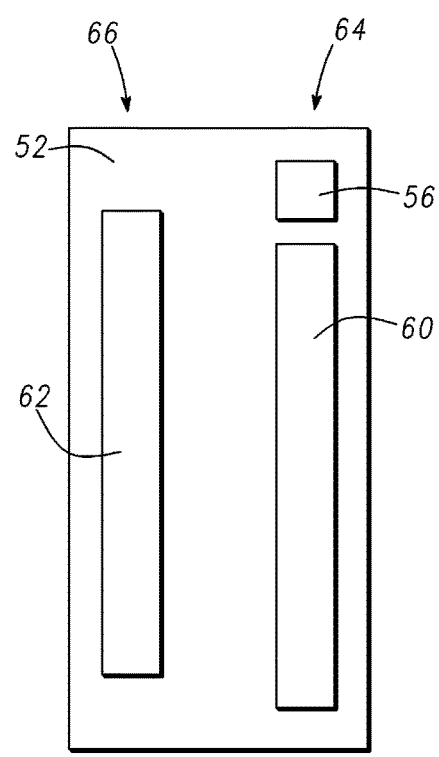
FIG. 4 is a top view of a semiconductor chip suitable for use in manufacturing a cascode configured semiconductor component in accordance with an embodiment of the present invention.

FIG. 4 is a top view of a semiconductor chip 50 suitable for use in manufacturing a semiconductor component in accordance with another embodiment of the present invention. Semiconductor chip 50 has a top surface 52 and a bottom surface 54 (shown in FIGS. 22-24), wherein a gate bond pad 56 is formed on or from a portion of top surface 52, a source bond pad 60 is formed on or from another portion of top surface 52, and a drain bond pad 62 (shown in FIGS. 20-24) is formed on or from yet another portion of top surface 52. Gate bond pad 56 and source bond pad 60 are formed on a side 64 of semiconductor chip 50 whereas drain bond pad 62 is formed on a side 66 of semiconductor chip 50. Sides 64 and 66 are on opposite sides of semiconductor chip 50. Semiconductor chip 50 is fabricated from a compound semiconductor material such as, for example, a III-nitride semiconductor material. Thus, semiconductor chip 50 may be referred to as a III-nitride semiconductor chip, i.e., the substrate material of III-nitride semiconductor chip 50 comprises a III-nitride material such as, for example, aluminum nitride. A III-nitride semiconductor material may be referred to as a III-N semiconductor material, a III-nitride based semiconductor material, a III-N based semiconductor material, or the like. A semiconductor chip such as, for example, semiconductor chip 50 may be referred to as a semiconductor die.

Figure 5:
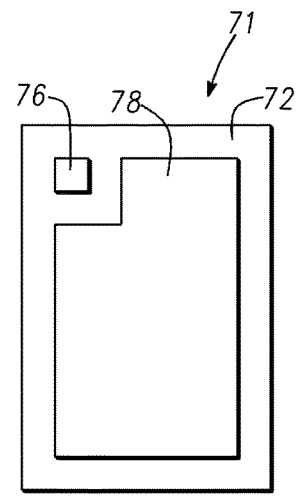
FIG. 5 is a top view of a semiconductor chip suitable for use in manufacturing a cascode configured semiconductor component in accordance with an embodiment of the present invention.

FIG. 5 is a top view of a semiconductor chip 70 suitable for use in manufacturing a semiconductor component in accordance with another embodiment of the present invention. Semiconductor chip 70 has a top surface 72 and a bottom surface 74. In accordance with an embodiment, semiconductor chip 70 is a silicon chip that may include a vertical field effect semiconductor device 71 having a gate bond pad 76 formed on or from top surface 72, a source bond pad 78 formed on or from top surface 72, and a drain bond pad 80 formed on or from bottom surface 74. It should be noted that semiconductor device 71 is not limited to being a vertical field effect transistor or a field effect transistor. For example, semiconductor device 71 may be an insulated gate bipolar transistor, a bipolar transistor, a junction field effect transistor, a diode, or the like. By way of example, semiconductor chip 70 is a silicon semiconductor chip, i.e., the substrate material of silicon semiconductor chip 70 comprises silicon. A silicon semiconductor material may be referred to as silicon based semiconductor material, a silicon semiconductor material, or the like. A semiconductor chip such as, for example, semiconductor chip 70 may be referred to as a semiconductor die.

Figure 6:
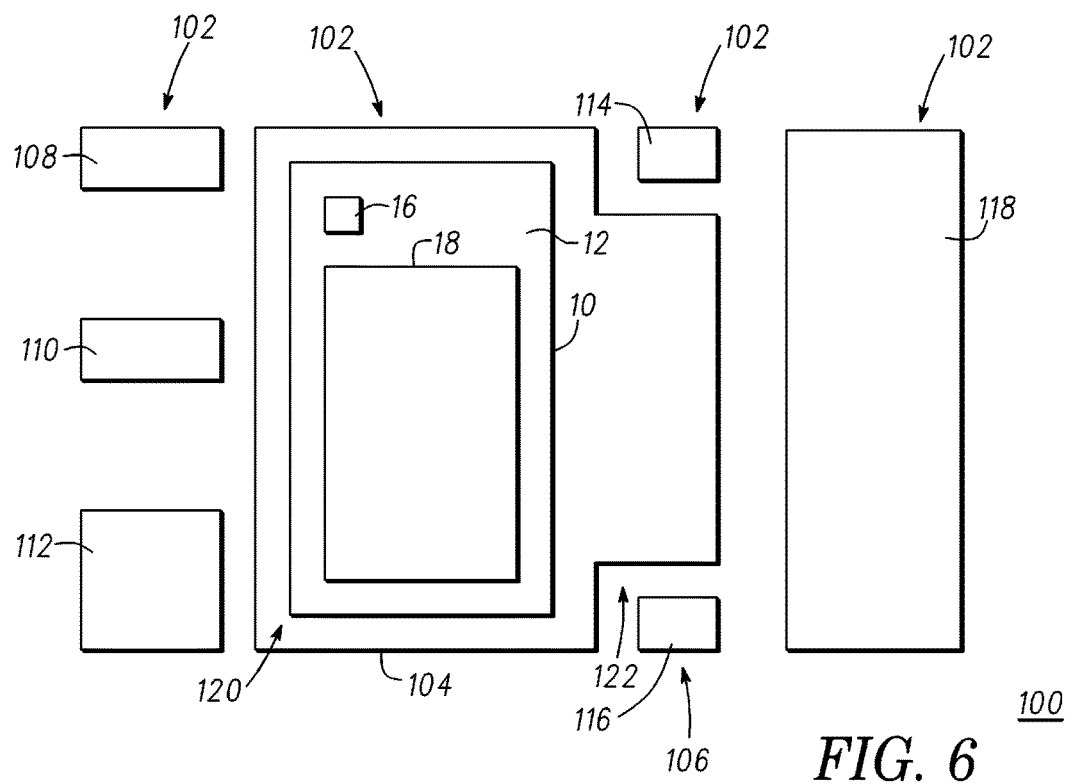
FIG. 6 is a top view of a cascode configured semiconductor component at a beginning stage of manufacture in accordance with an embodiment of the present invention.

FIG. 6 is a top view of a semiconductor component 100 comprising a support 102 that includes device receiving structures 104 and 106, a gate lead 108, a Kelvin lead 110, and a source lead 112, wherein support 102 is configured for packaging in a QFN package. Device receiving structure 104 includes a device receiving area 120 and a contact extension or tongue 122 and device receiving structure 106 includes interconnects 114 and 116, a drain contact area 118, and contact extension 122. Thus, contact extension 122 is common to device receiving structure 104 and device receiving structure 106. By way of example, device receiving area 120 is rectangularly shaped wherein a rectangularly shaped contact extension 122 extends therefrom. Interconnects 114 and 116 are formed laterally adjacent to and spaced apart from contact extension 122 and are electrically isolated from contact extension 122.

Gate lead 108, Kelvin lead 110, and source lead 112 may be rectangularly shaped leads that are spaced apart from and electrically isolated from device receiving structure 104. The shapes of leads 108, 110, and 112 are not limitations of the present invention.

A semiconductor chip 10 is mounted to device receiving area 120. As discussed with reference to FIG. 1, semiconductor chip 10 has a gate bond pad 16 formed on or from its top surface 12 and a source bond pad 18 formed on or from top surface 12. A drain contact 20 is formed on or from a bottom surface 14 (shown in FIGS. 7-9). The term mounted to can be referred to as being bonded to, being attached to, or the like.

Figure 7:
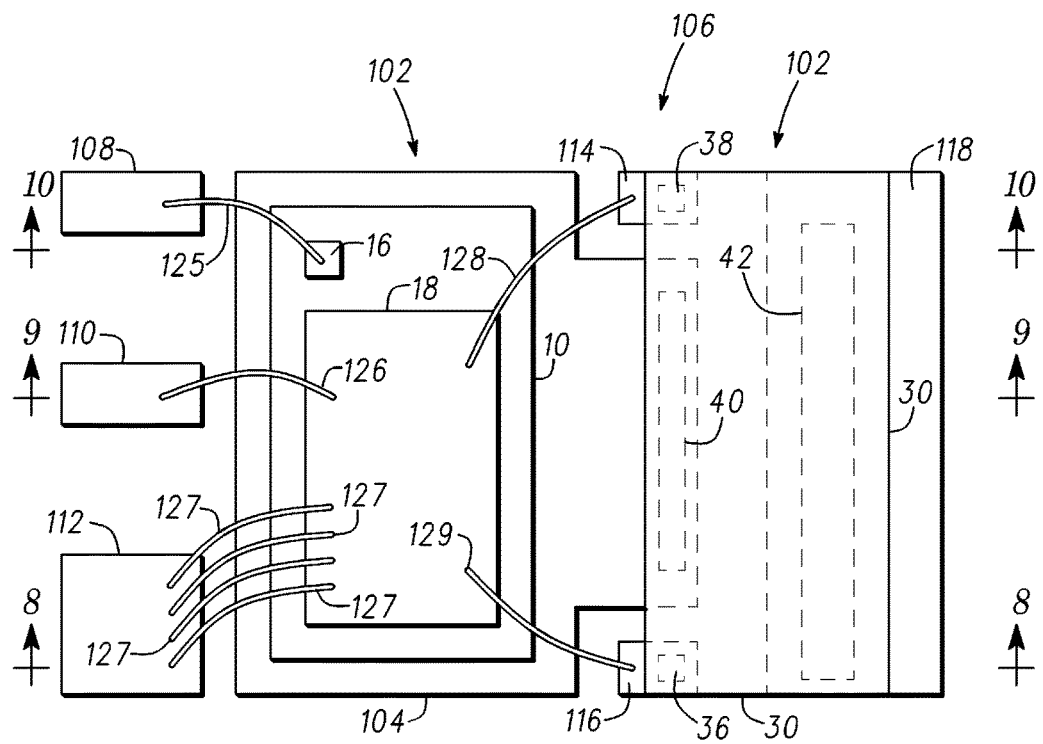
FIG. 7 is a top view of the cascode configured semiconductor component of FIG. 6 at a later stage of manufacture.

FIG. 7 is a top view of a semiconductor component 100 after semiconductor chip 30 has been mounted to device receiving structure 106 in a flip-chip configuration. Because semiconductor component 10 is in an upright configuration or an unflipped configuration and semiconductor component 30 is in a flipped configuration, semiconductor component 100 may be referred to as being in an upright-flipped configuration or a nonflipped-flipped configuration. Semiconductor chips 10 and 30 have been described with reference to FIGS. 1 and 3, respectively. Gate bond pads 38 and 36 of semiconductor chip 30 are bonded to interconnects 114 and 116, respectively, and drain bond pad 42 is bonded to drain contact area 118. Gate bond pads 36 and 38, source bond pad 40, and drain bond pad 42 are illustrated using broken lines or dashed lines because semiconductor chip 30 is flipped and bond pads 36, 38, 40 and 42 are hidden from view because they are facing interconnects 116, 114, contact extension 122, and drain contact area 118, respectively. It should be noted that the portions of contact extension 122 and drain contact area 30 that are below semiconductor chip 30 are shown as broken lines.

Gate bond pad 16 of semiconductor chip 10 is electrically connected to gate lead 108 by a bond wire 125. Source bond pad 18 of semiconductor chip 10 is electrically connected to Kelvin lead 110 by a bond wire 126, to source lead 112 by bond wires 127, to interconnect 114 by a bond wire 128, and to interconnect 116 by a bond wire 129.

Figure 8:
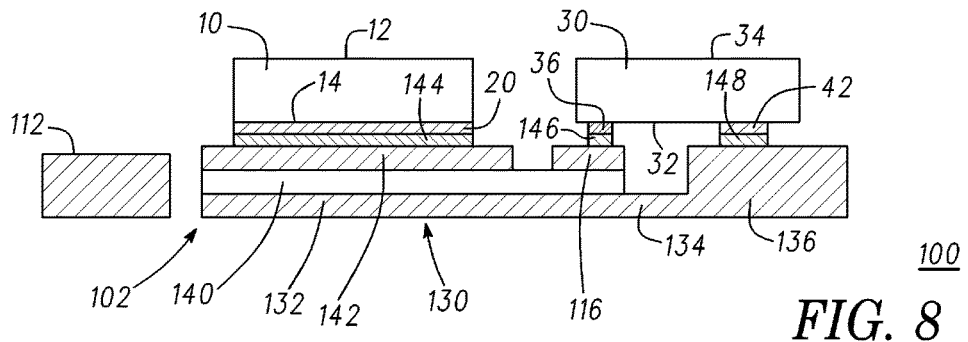
FIG. 8 is a cross-sectional view of the cascode configured semiconductor component of FIG. 7 taken along section line 8-8 of FIG. 7.
Figure 9:
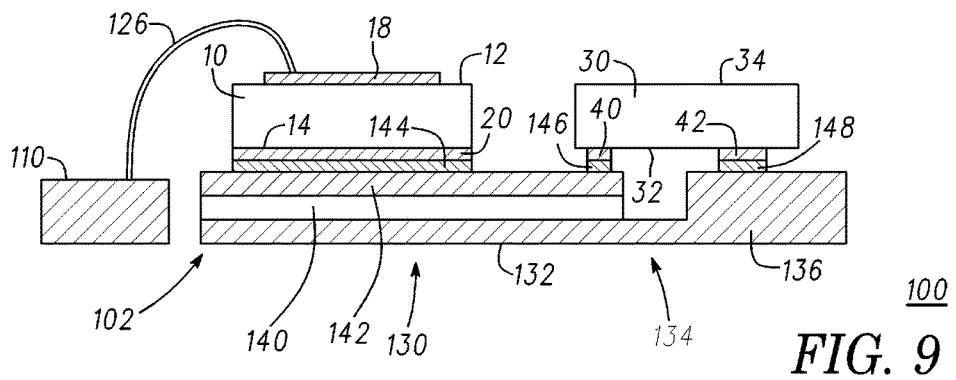
FIG. 9 is a cross-sectional view of the cascode configured semiconductor component of FIG. 7 taken along section line 9-9 of FIG. 7.
Figure 10:
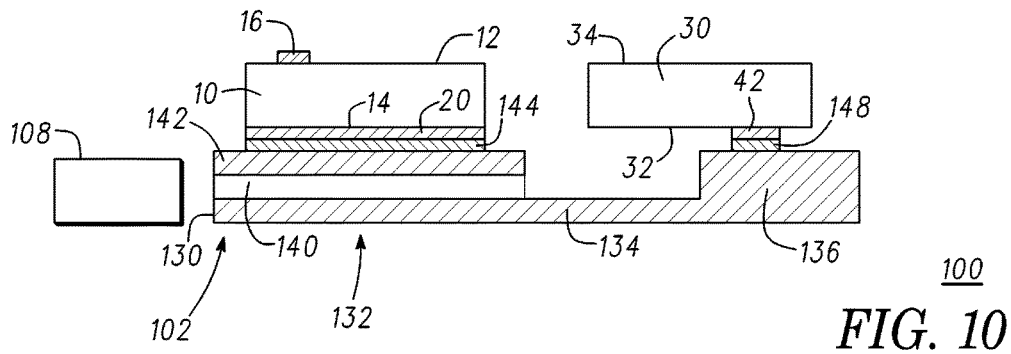
FIG. 10 is a cross-sectional view of the cascode configured semiconductor component of FIG. 7 taken along section line 10-10 of FIG. 7.

FIG. 8 is a cross-sectional view of semiconductor component 100 taken along section line 8-8 of FIG. 7, FIG. 9 is a cross-sectional view of semiconductor component 100 taken along section line 9-9 of FIG. 7, and FIG. 10 is a cross-sectional view of semiconductor component 100 taken along section line 10-10 of FIG. 7. For the sake of clarity, FIGS. 8-10 are described together. In accordance with an embodiment, support 102 is an electrically conductive substrate 130 having a mounting portion 132, a connector portion 134, and a pedestal portion 136, where mounting portion 132 is connected to mounting portion 136 through a connector portion 134. By way of example, electrically conductive substrate 130 comprises copper. Pedestal portion 136 is at an end of copper substrate 130 and extends vertically to a level that is higher than does mounting portion 132. A layer of electrically insulating material 140 is formed on mounting portion 132 of copper substrate 130. A layer of electrically conductive material 142 is formed on layer of insulating material 140. By way of example, layer of electrically conductive material 142 is copper. Techniques for forming an insulating material on an electrically conductive substrate and for forming an electrically conductive material on an insulating material are known to those skilled in the art. Alternatively, a direct bonded copper support having at least two electrically conductive layers separated by a dielectric material may be bonded to mounting portion 132 rather than bonding dielectric layer 140 to substrate 130 and bonding electrically conductive material 142 to insulating material 140. Direct bonded copper support may be referred to as an insulated metal substrate and insulating layer 140 may be referred to as dielectric layer or an insulating material.

Semiconductor chip 10 is bonded to layer of electrically conductive material 142 using, for example, solder 144. More particularly, drain electrode 20 of semiconductor chip 10 is bonded to layer of electrically conductive material 142 by solder 144. Similarly, gate bond pad 36 of semiconductor chip 30 is bonded to interconnect 116 by solder 146, gate bond pad 38 of semiconductor chip 30 is bonded to interconnect 114 by solder 146, drain bond pad 42 of semiconductor chip 30 is bonded to interconnect 114 by solder 146, source bond pad 40 is bonded to electrically conductive layer 142 by solder 146, and drain bond pad 42 is bonded to a portion of drain contact area 118 of pedestal 136 by solder 148.

As those skilled in the art are aware, support 102 including device receiving structures 104 and 106, semiconductor chips 10 and 30, and bond wires 125, 126, 127, 128, and 129 may be encapsulated in a protective material such as, for example, a mold compound (not shown). It should be noted that after encapsulation, gate lead 108, Kelvin lead 110, and source lead 112 extend from the mold compound.

Thus, semiconductor component 100 includes a III-N cascode switch in which the substrate of the III-N semiconductor material is electrically floating. Although semiconductor component 100 is shown as having bond pads not formed over active areas of semiconductor chips 10 and 30, this is not a limitation. Bond pads may be formed over active areas of semiconductor chip 10, semiconductor chip 30, or both, which lowers the cost of manufacture because additional area is not needed for bond pads. Forming the bond pads over active areas also increases the sizes of the bond pads which improves thermal performance because of an increased heat conduction.

It should be appreciated that semiconductor component 100 comprises a gallium nitride die 30 that is flipped and a silicon die 10 that is not flipped or that is upright. The electrically conductive pad 142 may serve as a flag, the gate lead serves as a post, the Kelvin lead serves as another post, and the source lead serves as yet another post. Silicon die 10 sits on or is positioned on an electrically conductive pad 142 that connects to the source of the flipped gallium nitride die. Electrically conductive pad 142 may be referred to as a layer of electrically conductive material. The gate pad of the flipped gallium nitride die sits on a copper piece that can be connected to the source of the silicon die with bond wires. Although FIG. 7 illustrates two gate bond pads, this is not a limitation, e.g., there may be a single gate bond pad. In addition, the position, shape, and size of the gate bond pad of the gallium nitride chip may be different than shown in FIG. 7. The source bond pad of silicon die 10 is connected to the external posts or leads using bond wires. Alternatively, the source bond pad of silicon die 10 may be connected to the external posts or leads using clips, which reduces parasitics in the power path. Similarly, the gate bond pad of the silicon chip may be connected to the gate post or gate lead using bond wires or clips. The position of the silicon chip on the semiconductor chip receiving area may be adjusted or moved so that the bond pads on the silicon chip are closer to the source lead or post, which allows the use of clips to further lower device parasitics.

Figure 11:
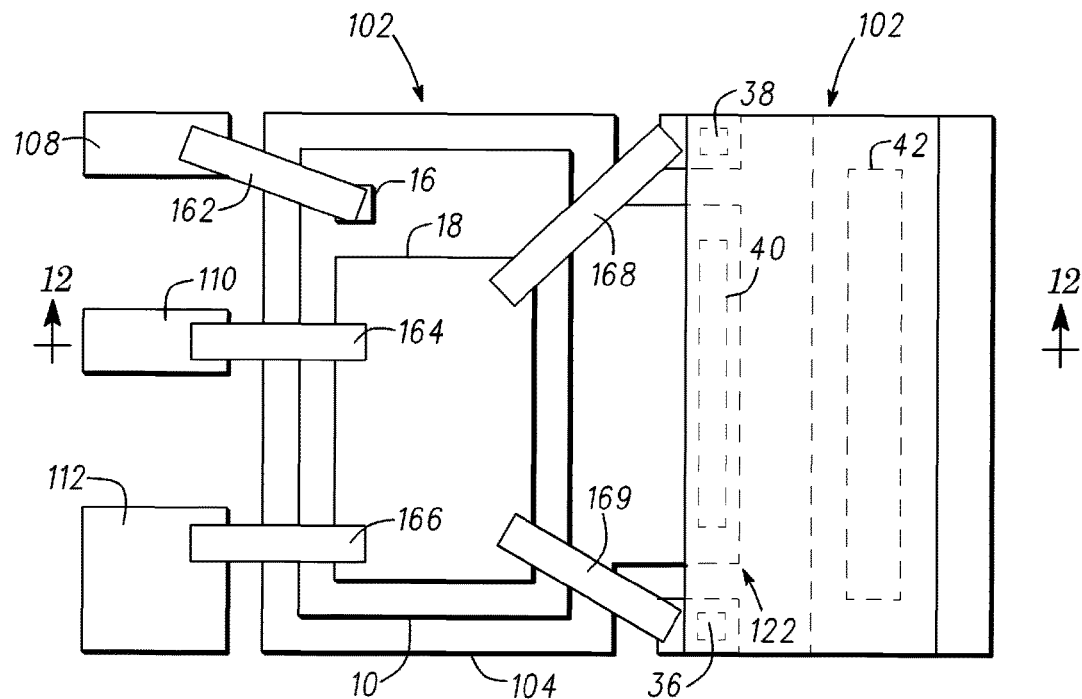
FIG. 11 is a top view of a cascode configured semiconductor component during manufacture in accordance with an embodiment of the present invention.
Figure 12:
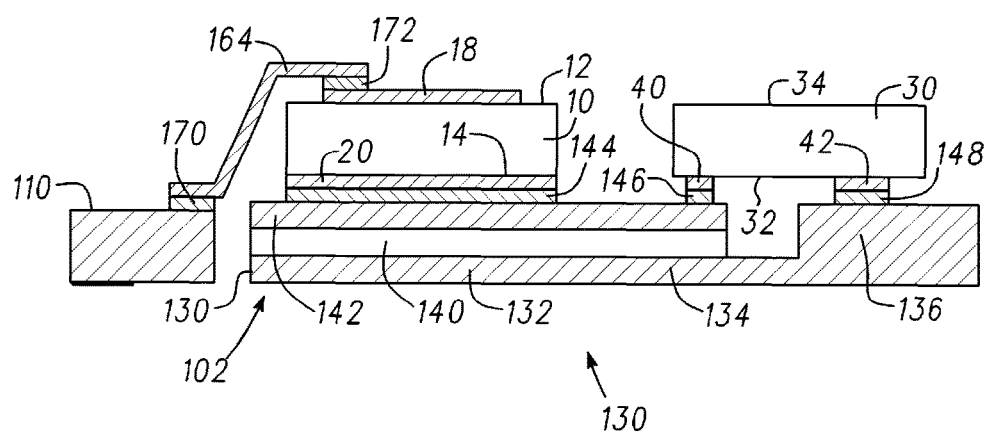
FIG. 12 is a cross-sectional view of the cascode configured semiconductor component of FIG. 11 taken along section line 12-12 of FIG. 11.

FIG. 11 is a top view of a semiconductor component 160 in accordance with another embodiment of the present invention. FIG. 12 is a cross-sectional view of semiconductor component 160 taken along section line 12-12 of FIG. 11. Semiconductor component 160 is similar to semiconductor component 100 except that bond wire 125 has been replaced by a clip 162, bond wire 126 has been replaced by an electrically conductive clip 164, bond wires 127 have been replaced by an electrically conductive clip 166, bond wire 128 has been replaced by an electrically conductive clip 168, and bond wire 129 has been replaced by an electrically conductive clip 169. FIG. 11 illustrates a clip 164 electrically connecting Kelvin lead 110 to source bond pad 18. An end of clip 164 is electrically connected to Kelvin lead 110 through a bonding agent 170 and the other end of clip 164 is electrically connected to source bond pad 18 through a bonding agent 172. Bonding agents 170 and 172 may be the same such as, for example, solder, or they may be different. Semiconductor component 160 is configured for packaging in a QFN package.

For the sake of clarity, clips 164, 166, 168, and 169 have been shown as individual clips, however this is not a limitation of the present invention. In accordance with an embodiment, clips 164, 166, 168, and 169 are formed as a single clip contacting source bond pad 18 with "fingers" leading out to Kelvin lead 110, source lead 112A, and interconnects 114 and 116. Alternatively, source bond pad 18 can be electrically coupled to source lead 112A by a clip and gate bond pad 16 can be electrically coupled to gate lead 108 by a bond wire, and source bond pad 18 may be electrically coupled to interconnects 114 and 116 by bond wires.

Figure 13:
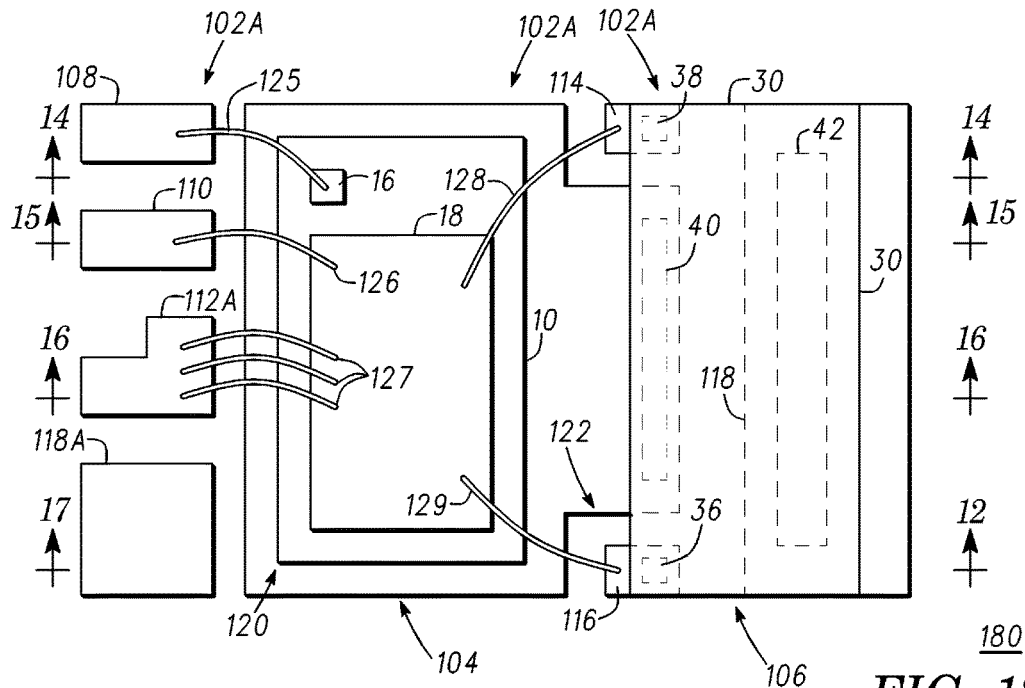
FIG. 13 is a top view of a cascode configured semiconductor component in accordance with another embodiment of the present invention.
Figure 14:
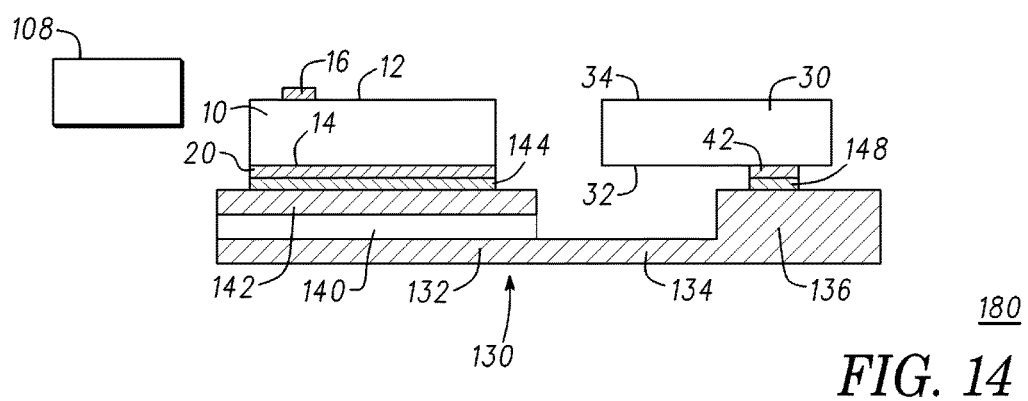
FIG. 14 is a cross-sectional view of the cascode configured semiconductor component of FIG. 13 taken along section line 14-14 of FIG. 13.
Figure 15:
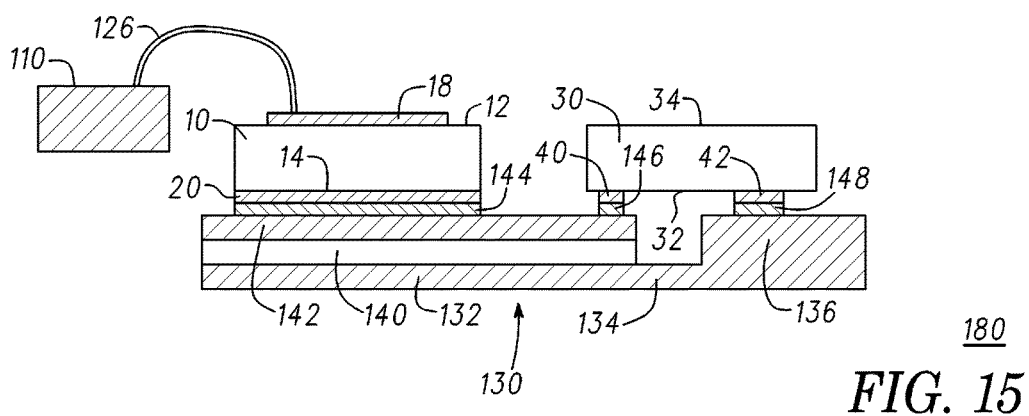
FIG. 15 is a cross-sectional view of the cascode configured semiconductor component of FIG. 13 taken along section line 15-15 of FIG. 13.
Figure 16:
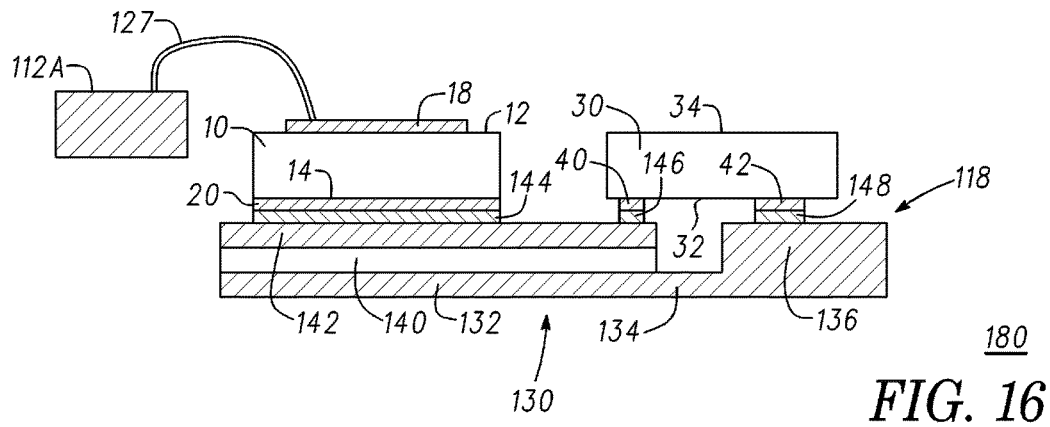
FIG. 16 is a cross-sectional view of the cascode configured semiconductor component of FIG. 13 taken along section line 16-16 of FIG. 13.
Figure 17:
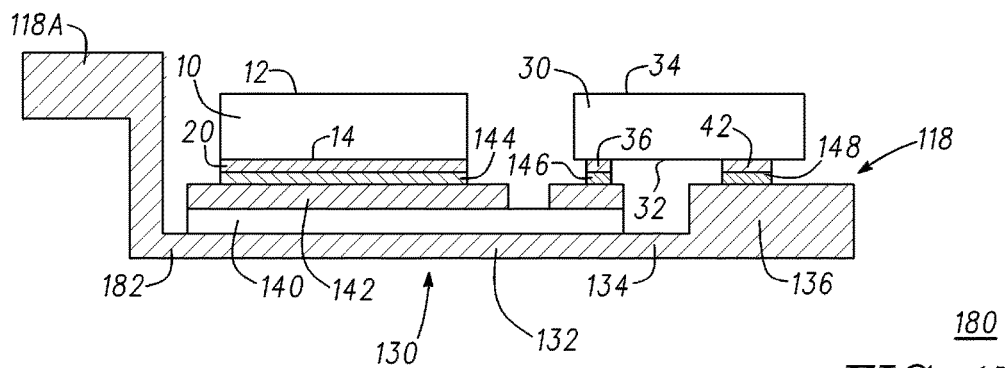
FIG. 17 is a cross-sectional view of the cascode configured semiconductor component of FIG. 13 taken along section line 17-17 of FIG. 13.

FIG. 13 is a top view of a semiconductor component 180 comprising a support 102A that includes device receiving structures 104 and 106, a gate lead 108, a Kelvin lead 110, a source lead 112A and a drain lead 118A. FIG. 14 is a cross-sectional view of semiconductor component 180 taken along section line 14-14 of FIG. 13, FIG. 15 is a cross-sectional view of semiconductor component 180 taken along section line 15-15 of FIG. 13, FIG. 16 is a cross-sectional view of semiconductor component 180 taken along section line 16-16 of FIG. 13, and FIG. 17 is a cross-sectional view of semiconductor component 180 taken along section line 17-17 of FIG. 13. For the sake of clarity, FIGS. 13-17 are described together. Support structure 102A includes device receiving structures 104 and 106, gate lead 108, and Kelvin lead 110 described with reference to FIG. 5. Source lead 112A differs from source lead 112 in that source lead 112A has an L-shaped configuration and is placed between drain lead 118A and Kelvin lead 110. In addition, drain lead 118A is electrically connected to drain contact area 118 and hence to drain bond pad 42 of semiconductor chip 30. It should be noted that a drain lead like drain lead 118A that extends outside a mold compound is absent from semiconductor components 100 and 160. Support 102A conforms with through hole package outlines such as a TO-220 outline, a TO-247 outline, a TO-264 outline, a TO-257 outline, or the like.

FIG. 17 further illustrates that drain lead 118A is connected to drain contact area 118 and hence to drain bond pad 42 of semiconductor chip 30 through copper substrate 130 and an electrical interconnect portion 182.

As those skilled in the art are aware, support 102A including device receiving structures 104 and 106, semiconductor chips 10 and 30, and bond wires 125, 126, 127, 128, and 129 may be encapsulated in a protective material such as, for example a mold compound. It should be noted that after encapsulation, gate lead 108, Kelvin lead 110, source lead 112, and drain lead 118A extend from the mold compound.

Thus, semiconductor component 180 includes a III-N cascode switch in which the substrate of the III-N semiconductor material is electrically floating and bond pads are not formed over active regions of semiconductor chips 10 and 30. Although semiconductor component 180 is shown as having bond pads not formed over active areas of semiconductor chips 10 and 30, this is not a limitation. Bond pads may be formed over active areas of semiconductor chip 10, semiconductor chip 30, or both, which lowers the cost of manufacture because additional area is not needed for bond pads. Forming the bond pads over active areas also increases the sizes of the bond pads which improves thermal performance because of an increased heat conduction. It should be noted that the package can be configured as a three-terminal device by removing Kelvin lead 110.

Figure 18:
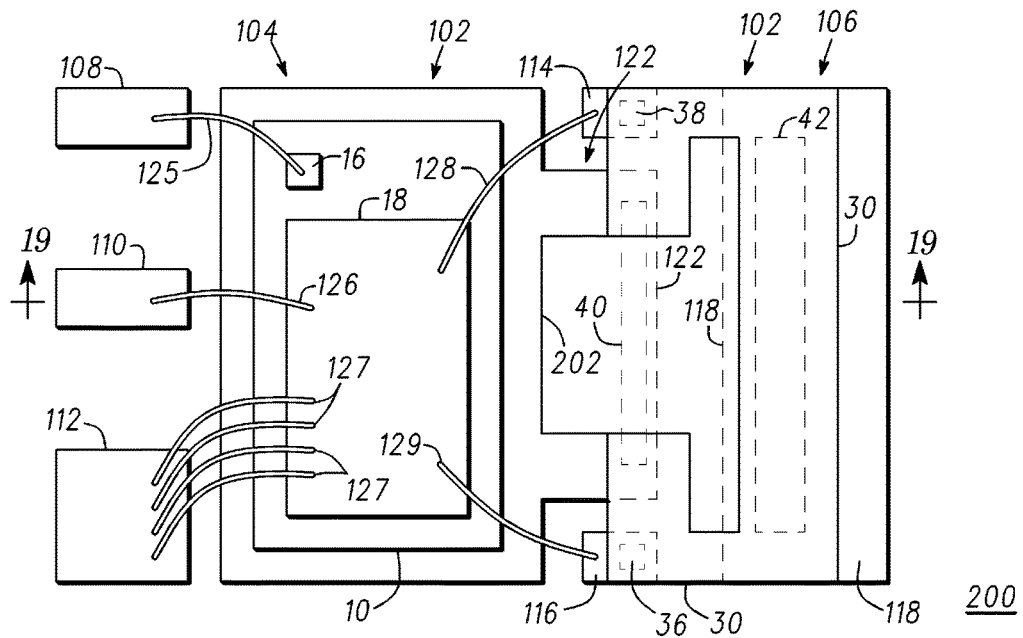
FIG. 18 is a top view of a cascode configured semiconductor component in accordance with another embodiment of the present invention.
Figure 19:
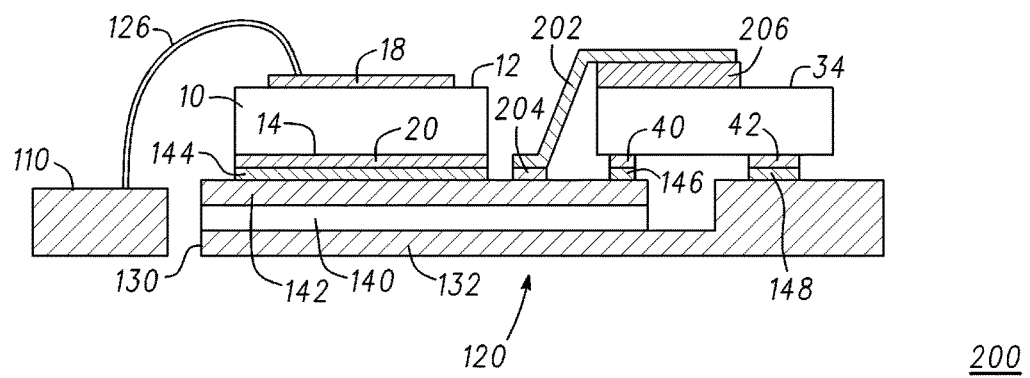
FIG. 19 is a cross-sectional view of the cascode configured semiconductor component of FIG. 18 taken along section line 19-19 of FIG. 18.

FIG. 18 is a top view of a semiconductor component 200 comprising a support 102 that includes device receiving structures 104 and 106, a gate lead 108, a Kelvin lead 110, and a source lead 112 in accordance with another embodiment of the present invention. FIG. 19 is a cross-sectional view of semiconductor component 200 taken along section line 19-19 of FIG. 18. FIGS. 18 and 19 are described together. Semiconductor component 200 is similar to semiconductor component 100 except that semiconductor component 200 includes a clip 202 coupling contact extension 122 to backside 34 of semiconductor chip 30. An end of clip 202 is electrically connected to contact extension 122 through an electrically conductive bonding agent 204 and the other end of clip 202 is electrically connected to backside 34 of semiconductor chip 30 through an electrically conductive die attach material 206. Alternatively, electrically conductive die attach material 206 may be a bonding agent. By way of example, bonding agents 204 and 206 are solder. The bonding agent is not limited to being solder and the bonding agents 204 and 206 may be different materials from each other. It should be noted that a metallization system may be formed on or from backside 34 in preparation for bonding an end of clip 202 to backside 34. Support 102 is configured for packaging in a QFN package.

Thus, semiconductor component 200 includes a III-N cascode switch in which the substrate of the III-N semiconductor material is electrically connected to a source of potential through clip 202, i.e., clip 202 connects the substrate from the back side of flipped gallium nitride chip 30 to contact extension 122. Although semiconductor component 200 is shown as having bond pads not formed over active areas of semiconductor chips 10 and 30, this is not a limitation. Bond pads may be formed over active areas of semiconductor chip 10, semiconductor chip 30, or both, which lowers the cost of manufacture because additional area is not needed for bond pads. Forming the bond pads over active areas also increases the sizes of the bond pads which improves thermal performance because of an increased heat conduction.

Figure 20:
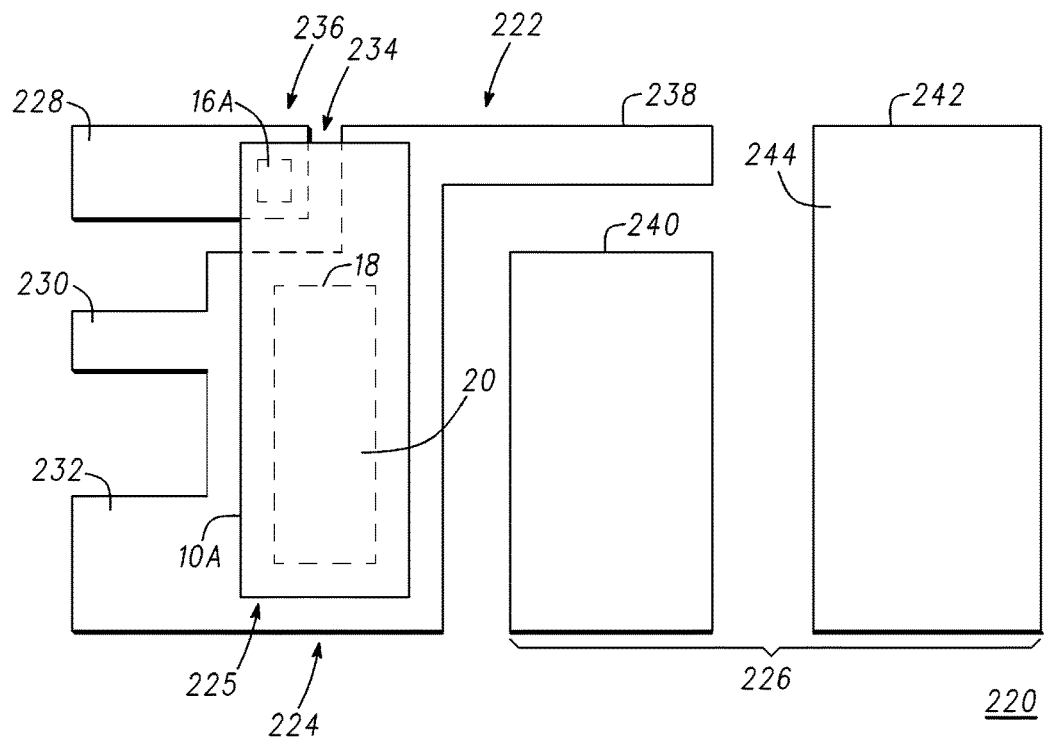
FIG. 20 is a top view of a cascode configured semiconductor component at a beginning stage of manufacture in accordance with another embodiment of the present invention.

FIG. 20 is a top view of a semiconductor component 220 comprising a support 222 that includes device receiving structures 224 and 226, a gate lead 228, a Kelvin lead 230, and a source lead 232. Support 222 is configured for packaging in a QFN package. Device receiving structure 224 includes a rectangularly shaped device receiving area 225 having a notch 234 at one of its corners. Gate lead 228 has an end 236 that mates with notch 234 and an end that extends away from notch 234 of device receiving area 225. End 236 is spaced apart and electrically isolated from device receiving area 225, wherein end 236 is configured to mate with a bond pad 16A. An extension 238 extends from a side of device receiving area 225 that is opposite the side containing notch 234. Extension 238 in combination with device receiving area 225 forms an L-shaped structure. Device receiving structure 226 includes a rectangular shaped interconnect structure 240 that is spaced apart from and electrically isolated from device receiving area 225 and extension 238, i.e., the L-shaped structure. Device receiving structure 226 further includes a pedestal 242 having a surface 244 which serves as a drain contact area and is configured to mate with a semiconductor chip.

Alternatively, gate lead 228, Kelvin lead 230, and source lead 232 may be rectangularly shaped leads that are spaced apart and electrically isolated from device receiving area 225. The sizes and shapes of leads 228, 230, and 232 are not limitations of the present invention.

FIG. 20 further illustrates a semiconductor chip such as, for example semiconductor chip 10A (shown in FIG. 2) mounted to device receiving area 225 of support 222 in a flip-chip configuration. Semiconductor chip 10A includes a gate bond pad 16A, a source bond pad 18, and a drain contact 20, wherein gate bond pad 16A and source bond pad 18 are shown as dashed lines because they are hidden from view by the body of semiconductor material of semiconductor chip 10A.

Figure 21:
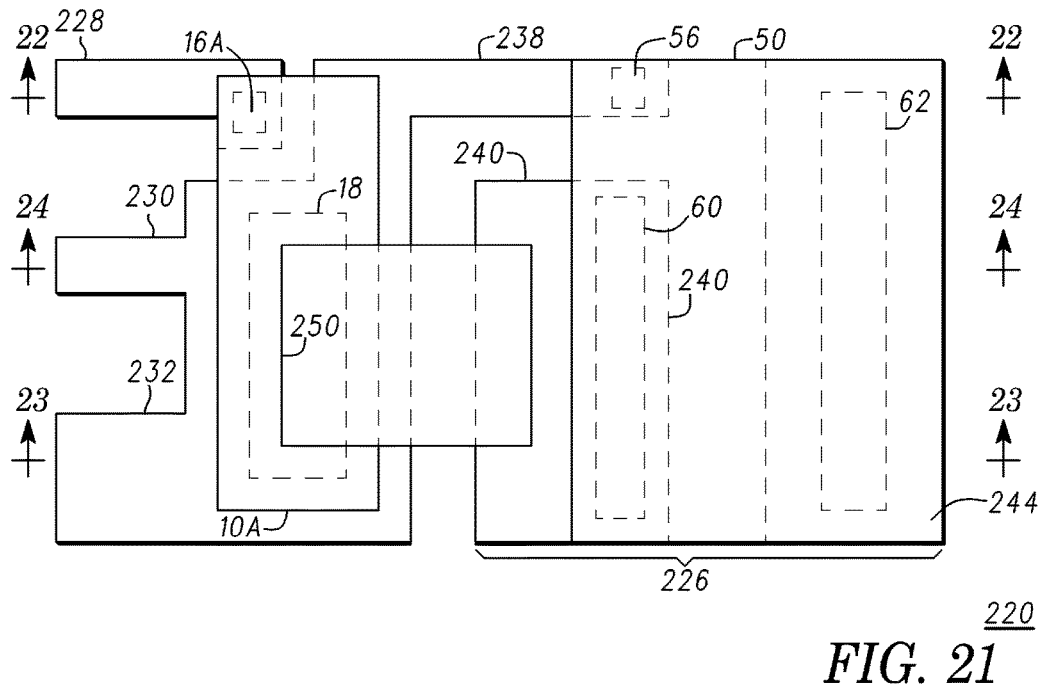
FIG. 21 is a top view of the cascode configured semiconductor component of FIG. 20 at a later stage of manufacture.

FIG. 21 is a top view of semiconductor component 220 after semiconductor chip 50 has been mounted to device receiving structure 226 in a flip-chip configuration. Because semiconductor component 10A is in a flipped configuration and semiconductor component 50 is in a flipped configuration, semiconductor component 220 may be referred to as being in a flipped-flipped configuration. Semiconductor chips 10A and 50 have been described with reference to FIGS. 2 and 4, respectively. Gate bond pad 56 of semiconductor chip 50 is bonded to extension 238 and drain bond pad 62 is bonded to surface 244 of pedestal 242, wherein pedestal 242 serves as a drain contact area. Gate bond pad 56, source bond pad 60, and drain bond pad 62 are illustrated using broken lines because semiconductor chip 50 is flipped such that bond pads 56, 60 and 62 face extension 238, interconnect structure 240, and pedestal 242, respectively. It should be noted that the portions of extension 238, interconnect structure 240, and pedestal 242 that are below semiconductor chip 50 are shown as broken lines. Pedestal 242 may be referred to as a drain contact area.

Drain contact 20 of semiconductor chip 10A is electrically connected to interconnect structure 240 by an electrically conductive clip 250.

Figure 22:
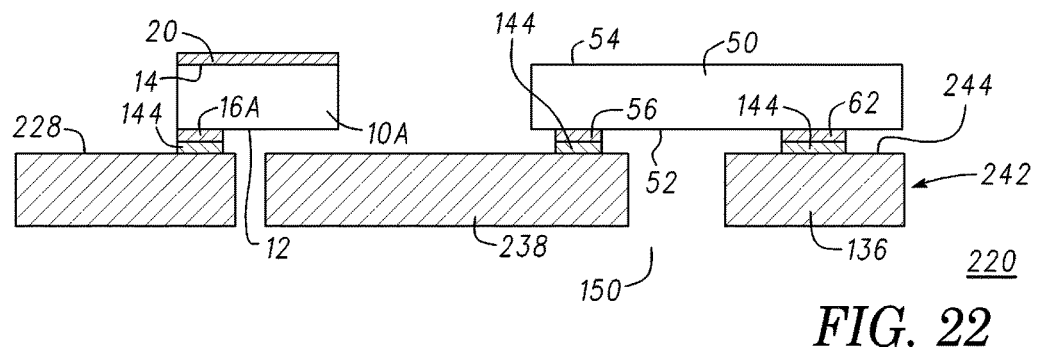
FIG. 22 is a cross-sectional view of the cascode configured semiconductor component of FIG. 21 taken along section line 22-22 of FIG. 21.
Figure 23:
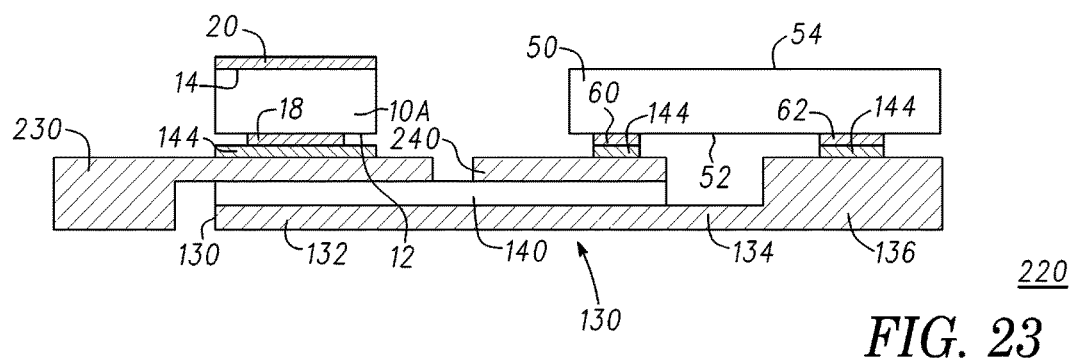
FIG. 23 is a cross-sectional view of the cascode configured semiconductor component of FIG. 21 taken along section line 23-23 of FIG. 21.
Figure 24:
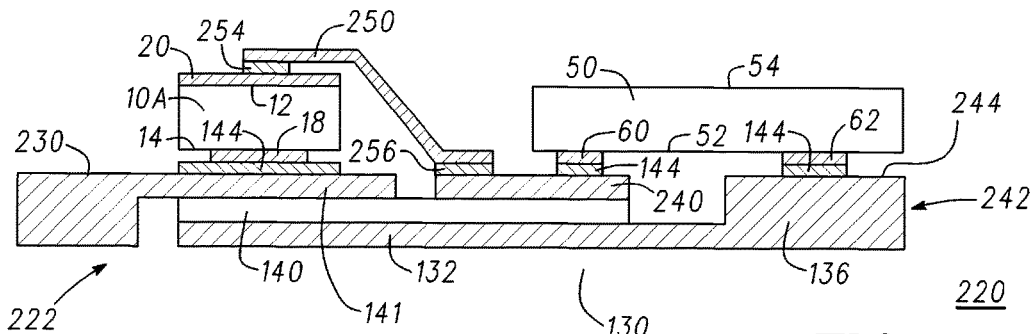
FIG. 24 is a cross-sectional view of the cascode configured semiconductor component of FIG. 21 taken along section line 24-24 of FIG. 21.

FIG. 22 is a cross-sectional view of semiconductor component 220 taken along section line 22-22 of FIG. 21, FIG. 23 is a cross-sectional view of semiconductor component 220 taken along section line 23-23 of FIG. 21, and FIG. 24 is a cross-sectional view of semiconductor component 220 taken along section line 24-24 of FIG. 21. For the sake of clarity, FIGS. 22-24 are described together. In accordance with an embodiment, support 222 is an electrically conductive substrate 130 having a mounting portion 132, a connector portion 134, and a pedestal portion 136, where mounting portion 132 is connected to mounting portion 136 through a connector portion 134 that has been described with reference to FIGS. 7-10. In addition, a dielectric layer 140 may be bonded to electrically conductive substrate 130 and an electrically conductive material 142 may be bonded to dielectric layer 140 as described with reference to FIGS. 7-10. Alternatively, a direct bonded copper support having at least two electrically conductive layers separated by a dielectric material may be bonded to mounting portion 132 rather than bonding dielectric layer 140 to substrate 130 and bonding electrically conductive material 142 to insulating material 140.

Mounting portion 136 is at an end of copper substrate 130 and extends vertically to a level that is higher than does mounting portion 132. The vertically extending portion of mounting portion 136 may be referred to as a pedestal 242, which pedestal 242 has a pedestal surface 244. A layer of electrically insulating material 140 is formed on mounting portion or mating portion 132 of copper substrate 130. A layer of electrically conductive material is formed on a portion of layer of insulating material 140 and serves as device receiving structure 224. Device receiving structure 224 has leads 230 and 232 extending from one side and an extension 238 extending from an opposing side. Thus, support 202 is configured such that leads 230 and 232 and extension 238 are not formed over layer of insulating material 140. A layer of electrically conductive material is formed on a portion of layer of insulating material 140 and serves as interconnect structure 240. By way of example, the electrically conductive material of device receiving area 225 and the electrically conductive material of interconnect structure 240 are copper.

Semiconductor chip 10A is bonded to device receiving area 225 using an electrically conductive bonding agent such as, for example, solder 144. More particularly, source electrode 18 of semiconductor chip 10 is bonded to device receiving structure 224 by solder 144. Similarly, gate bond pad 16A of semiconductor chip 10A is bonded to gate lead 228 by solder 144 and drain contact 20 is coupled to interconnect structure 240 by clip 250. More particularly, clip 250 has an end that is electrically connected to drain contact 20 through electrically conductive bonding agent 254 and the other end of clip 250 is electrically connected to interconnect structure 240 through an electrically conductive bonding agent 256. By way of example, bonding agents 254 and 256 are solder. It should be noted that the bonding agent is not limited to being solder and that bonding agents 254 and 256 may be the same or different materials.

Gate bond pad 56 of semiconductor chip 50 is bonded to a portion of extension 238 by solder 144, source bond pad 60 is bonded to interconnect structure 240 through solder 144, and drain bond pad 62 is bonded to a portion of pedestal 242 by solder 144.

As those skilled in the art are aware, support 222 including device receiving structures 224 and 226, semiconductor chips 10A and 50, and clip 250 may be encapsulated in a protective material such as, for example a mold compound (not shown). It should be noted that after encapsulation, gate lead 228, Kelvin lead 230, and source lead 232 extend from the mold compound.

Thus, semiconductor component 220 includes a III-N cascode switch in which the substrate of the III-N semiconductor material is electrically floating. Although semiconductor component 220 is shown as having bond pads not formed over active areas of semiconductor chips 10A and 50, this is not a limitation. Bond pads may be formed over active areas of semiconductor chip 10A, semiconductor chip 50, or both.

In accordance with this embodiment, both silicon chip 10A and gallium nitride chip 50 are flipped, wherein source bond pad 18 is bonded to Kelvin lead 230 and source lead 232, i.e., bond wires or clips are absent. In addition, gate bond pad 16A sits directly on the extension for gate lead or gate post 228. In accordance with this embodiment, drain bond pad 20 of silicon chip 10A is connected to source bond pad 60 of gallium nitride chip 50 by a clip 250. Alternatively, clip 250 may be replaced with one or more bond wires. Gate pad 56 of gallium nitride chip 50 is connected to source bond pad 18 of semiconductor chip 10 through the electrically conductive material of device receiving area 224.

Figure 25:
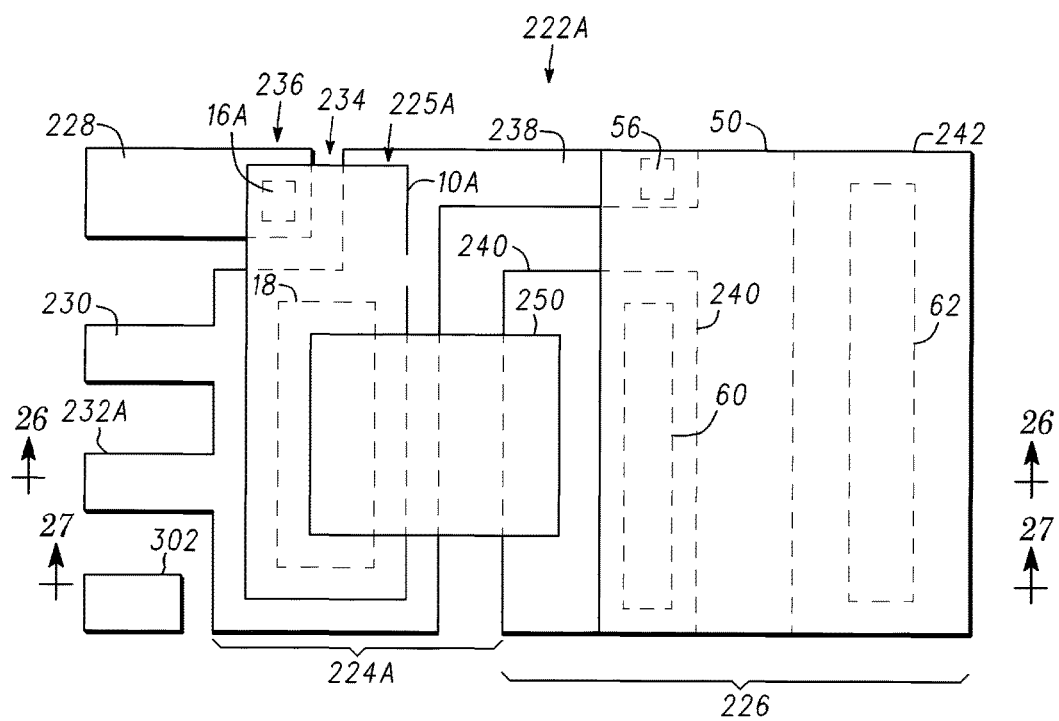
FIG. 25 is a top view of a cascode configured semiconductor component in accordance with another embodiment of the present invention.

FIG. 25 is a top view of a semiconductor component 300 comprising a support 222A that includes device receiving structures 224A and 226, a gate lead 228, a Kelvin lead 230, and a source lead 232A, and a drain lead 302. Support 222A is similar to support 222 except that source lead 232A is configured differently from source lead 232 and a drain lead 302 is formed adjacent to device receiving structure 224A. Device receiving structure 224A includes a rectangularly shaped device receiving area 225A having a notch 234 at one of its corners, leads 230 and 232A extending from one side of device receiving area 225A and extension 238 extending from a side that is opposite the side of device receiving area 225A from which leads 230 and 232A extend. A semiconductor chip such as, for example semiconductor chip 10A (shown in FIG. 2) is mounted to device receiving area 225A in a flip-chip configuration and semiconductor chip 50 is mounted to device receiving structure 226 in a flip-chip configuration. Semiconductor chips 10A and 50 are in a fashion that is similar to semiconductor chips 10A and 50 being mounted to device receiving structures 224A and 226 as described with reference to FIG. 20. Because semiconductor chip 10A is in a flipped configuration and semiconductor chip 50 is in a flipped configuration, semiconductor component 220 may be referred to as being in a flipped-flipped configuration. Gate lead 228, Kelvin lead 230, and source lead 232A are rectangularly shaped leads that are integral with and extend from device receiving area 225A. It should be noted that the sizes and shapes of leads 228, 230, and 232A are not limitations of the present invention. Support 222A conforms with through hole package outlines such as a TO-220 outline, a TO-247 outline, a TO-264 outline, a TO-257 outline, or the like.

Figure 26:
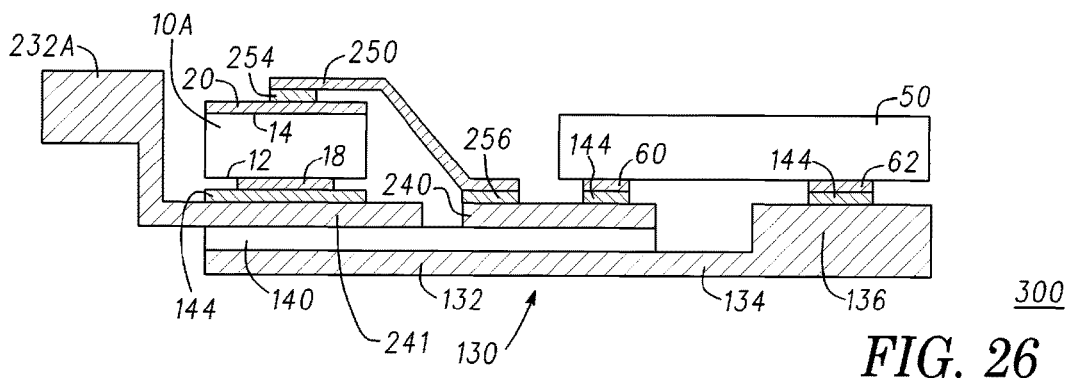
FIG. 26 is a cross-sectional view of the cascode configured semiconductor component of FIG. 25 taken along section line 26-26 of FIG. 25.
Figure 27:
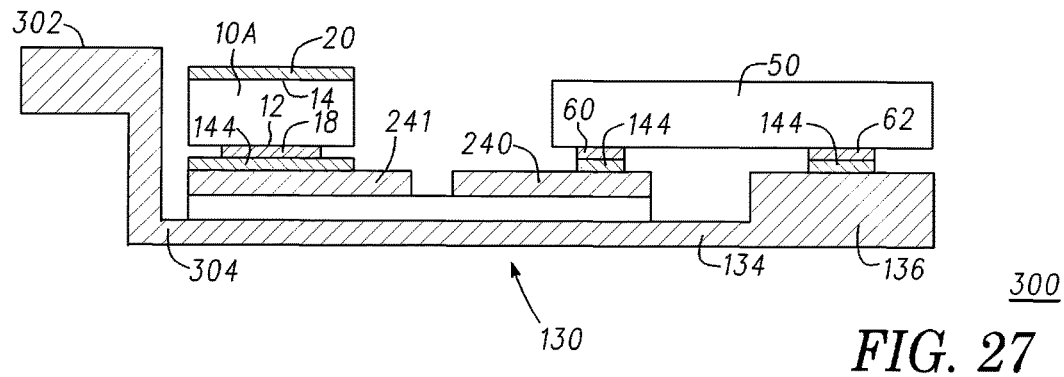
FIG. 27 is a cross-sectional view of the cascode configured semiconductor component of FIG. 26 taken along section line 27-27 of FIG. 26.

FIG. 26 is a cross-sectional view of semiconductor component 300 taken along section line 26-26 of FIG. 25 and FIG. 27 is a cross-sectional view of semiconductor component 300 taken along section line 27-27 of FIG. 25. FIGS. 26 and 27 illustrate that in accordance with an embodiment, support 222A comprises an electrically conductive substrate 130 having a mounting portion 132, a connector portion 134, and a pedestal portion 136, where mounting portion 132 is connected to mounting portion 136 through a connector portion 134 and has been described with reference to FIGS. 7-10. In addition, a dielectric layer 140 may be bonded to electrically conductive substrate 130. An electrically conductive material 241 may be bonded to a portion of dielectric layer 140 and an electrically conductive material 240 may be bonded to another portion of dielectric layer 140. Techniques for bonding an electrically conductive material to a dielectric material are known to those skilled in the art. Alternatively, a direct bonded copper support having at least two electrically conductive layers separated by a dielectric material may be bonded to mounting portion 132 rather than bonding dielectric layer 140 to substrate 130 and bonding electrically conductive material 241 and electrically conductive material 240 to insulating material 140.

By way of example, electrically conductive substrate 130, electrically conductive material 240 and electrically conductive material 241 are copper. In accordance with an embodiment, pedestal portion 136 is at an end of copper substrate 130 and extends vertically to a level that is higher than does mounting portion 132. Layer of electrically conductive material 241 serves as device receiving area 225A. Device receiving area 225A has leads 230 and 232A extending from one side and an extension 238 extending from an opposing side. Thus, semiconductor component 300 is configured such that leads 230 and 232A and extension 238 are not formed over layer of insulating material 140. A layer of electrically conductive material is formed on a portion of layer of insulating material 140 and serves as interconnect structure 240.

Referring now to FIG. 27, support 222A further includes a conductive connector 304 that connects substrate 130 to drain lead 302. It should be noted that substrate 130, connector 302 connector 134, and pedestal 136 may be formed from a single piece of electrically conductive material such as, for example, a single piece of copper.

Thus, semiconductor component 300 includes a III-N cascode switch in which the substrate of the III-N semiconductor material is electrically floating. Although semiconductor component 300 is shown as having bond pads that are not formed over active areas of semiconductor chips 10A and 50, this is not a limitation of the present invention. Bond pads may be formed over active areas of semiconductor chip 10A, semiconductor chip 50, or both.

Figure 28:
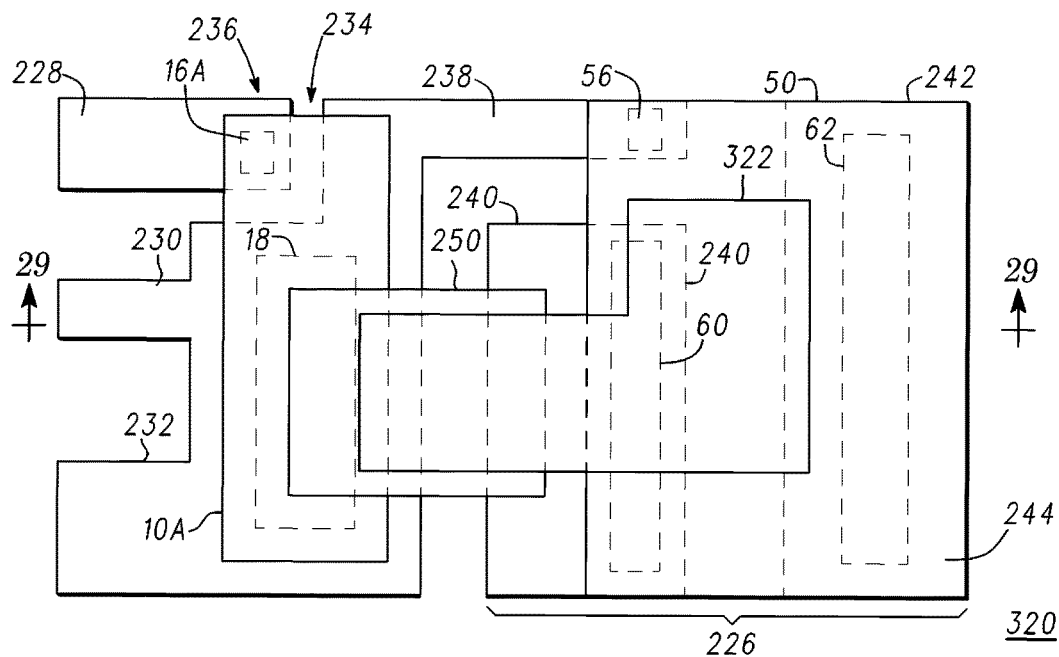
FIG. 28 is a top view of a cascode configured semiconductor component in accordance with another embodiment of the present invention.
Figure 29:
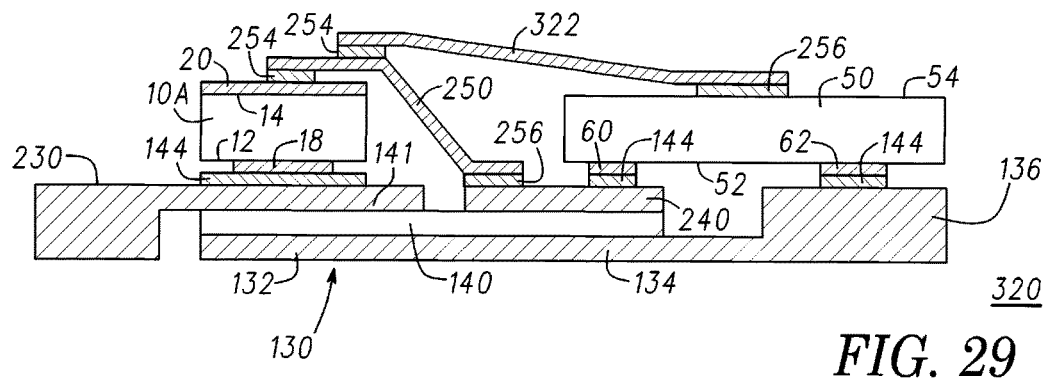
FIG. 29 is a cross-sectional view of the cascode configured semiconductor component of FIG. 28 taken along section line 29-29 of FIG. 28.

FIG. 28 is a top view of a semiconductor component 320 in accordance with another embodiment of the present invention. FIG. 29 is a cross-sectional view of semiconductor component 320 taken along section line 29-29 of FIG. 28. Semiconductor component 320 is similar to semiconductor component 220 described with reference to FIGS. 20-24, except that semiconductor component 320 includes a clip 322 that electrically connects clip 250 to the substrate of semiconductor chip 50. More particularly, clip 322 has an end that is electrically connected to clip 250 through electrically conductive bonding agent 254 and an end is electrically connected to the substrate material of semiconductor chip 50 through an electrically conductive bonding agent 256. By way of example, bonding agents 254 and 256 are solder. It should be noted that the bonding agent is not limited to being solder and that bonding agents 254 and 256 may be the same material or different materials. Semiconductor component 320 is configured for packaging in a QFN package.

Thus, semiconductor component 320 includes a III-N cascode switch in which the substrate of the III-N semiconductor material is electrically connected to a source of potential such as, for example, ground. Although semiconductor component 320 is shown as not having bond pads formed over active areas of semiconductor chips 10A and 50, this is not a limitation. Bond pads may be formed over active areas of semiconductor chip 10A, semiconductor chip 50, or both.

Figure 30:
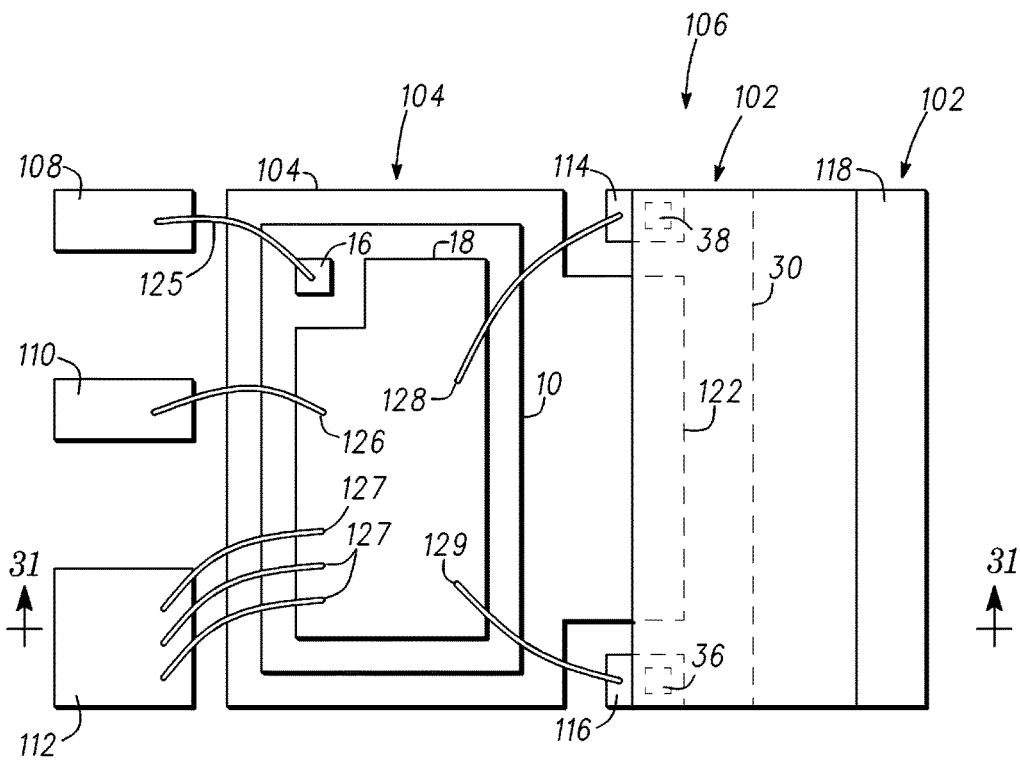
FIG. 30 is a top view of a cascode configured semiconductor component in accordance with another embodiment of the present invention.
Figure 31:
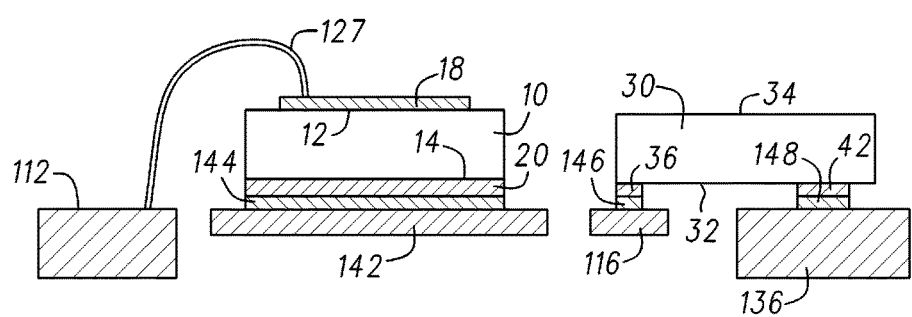
FIG. 31 is a cross-sectional view of the cascode configured semiconductor component of FIG. 30 taken along section line 31-31 of FIG. 30.

FIG. 30 is a top view of a semiconductor component 330 comprising a support 102 that includes device receiving structures 104 and 106, a gate lead 108, a Kelvin lead 110, and a source lead 112 in accordance with another embodiment of the present invention. FIG. 31 is a cross-sectional view of semiconductor component 330 taken along section line 31-31 of FIG. 30. FIGS. 30 and 31 are described together for the sake of clarity. Semiconductor component 330 is similar to semiconductor component 100 described with reference to FIGS. 5-9 except that mounting portion 132, connector portion 134, insulating layer 140 are absent from semiconductor component 330. Thus, a mold compound is formed below interconnect 116 and electrically conductive material 142. Semiconductor component 330 is configured for packaging in a QFN package.

Thus, semiconductor component 330 includes a III-N cascode switch in which the substrate of the III-N semiconductor material is electrically floating. Although semiconductor component 330 is shown as not having bond pads formed over active areas of semiconductor chips 10 and 30, this is not a limitation. Bond pads may be formed over active areas of semiconductor chip 10, semiconductor chip 30, or both.

Figure 32:
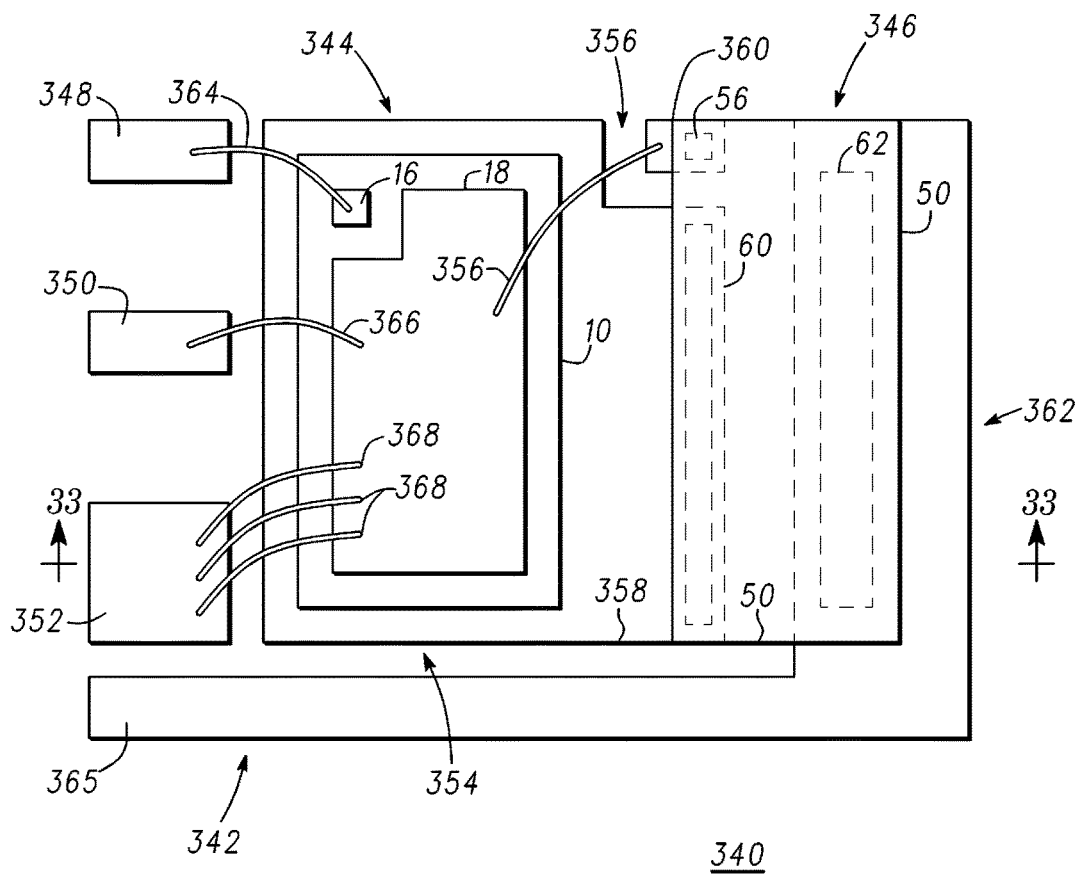
FIG. 32 is a top view of a cascode configured semiconductor component in accordance with another embodiment of the present invention.

FIG. 32 is a top view of a semiconductor component 340 comprising a support 342 that includes device receiving structures 344 and 346, a gate lead 348, a Kelvin lead 350, and a source lead 352. Device receiving structure 344 may be a rectangularly shaped electrically conductive pad having a device receiving area 354 with a notch 356 at one of its corners. Thus, device receiving structure 344 is configured to have a rectangularly shaped device receiving area 354 having a notch 356 thereby forming a tab portion or structure 358 extending from one side, i.e., device receiving structure 346 comprises a conductive interconnect 360 positioned in notch 356, a portion of tab structure 358, and an electrically conductive body 362 configured for mating with a drain bond pad 62 of semiconductor chip 50. Thus, tab 358 is common to device receiving structures 344 and 346. Support 342 further includes a drain lead 364 extending from electrically conductive body 362. Electrically conductive body 362 and drain lead 364 are electrically isolated from device receiving structure 344.

FIG. 32 further illustrates a semiconductor chip such as, for example, semiconductor chip 10 (shown in FIG. 1) mounted to device receiving structure 344 of support 342 and a semiconductor chip 50 mounted to device receiving structure 346 to form a semiconductor component 340. Gate bond pad 16 is electrically connected to gate lead 348 by a bond wire 364, source bond pad 18 is electrically connected to Kelvin lead 350 by a bond wire 366 and to source lead 352 by bond wires 368. Gate bond pad 56, source bond pad 60, and drain bond pad 62 are indicated by broken lines because semiconductor chip 50 is mounted to device receiving structure 346 in a flip-chip configuration and are therefore blocked from view by the body of semiconductor chip 50.

Gate lead 348, Kelvin lead 350, and source lead 352 are rectangularly shaped leads that are spaced apart from and electrically isolated from device receiving structure 344.

Figure 33:
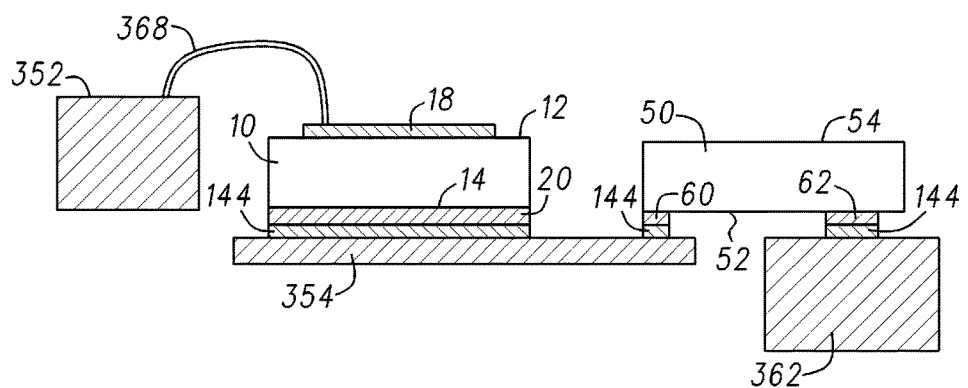
FIG. 33 is a cross-sectional view of the cascode configured semiconductor component of FIG. 32 taken along section line 33-33 of FIG. 32.

FIG. 33 is a cross-sectional view of semiconductor component 340 taken along section line 33-33 of FIG. 32. What is shown in FIG. 33 are device receiving area 354 and tab portion 358 of device receiving structure 344 and electrically conductive body 362 that is a portion of device receiving structure 346.

Support 342 conforms with through hole package outlines such as a TO-220 outline, a TO-247 outline, a TO-264 outline, a TO-257 outline, or the like.

Semiconductor chip 10 is bonded to device receiving structure 344 using, for example, solder 144. More particularly, drain electrode 20 of semiconductor chip 10 is bonded to device receiving area 354 of device receiving structure 344 by solder 144. Source bond pad 18 is coupled to source lead 352 by a bond wire 368.

Gate bond pad 56 of semiconductor chip 50 is bonded to a portion of extension 238 by a bonding agent 144, source bond pad 60 is bonded tab portion 358 of device receiving structure 344 by bonding agent 144, and drain bond pad 62 is bonded to a portion of electrically conductive body 362 that serves as a drain contact area by bonding agent 144. By way of example, bonding agent 144 is solder. It should be noted that a cross-sectional view of drain lead 364 and electrically conductive body 362 would show the electrically conductive material having a thickness of electrically conductive body 362, i.e., the solid piece of electrically conductive material would represent portions of electrically conductive body 362, drain lead extension 365, and drain lead 364.

As those skilled in the art are aware, support 342 including device receiving structures 344 and 346, semiconductor chips 10 and 50, and bond wires 364, 366, and 368 may be encapsulated in a protection material such as, for example a mold compound (not shown). It should be noted that after encapsulation, gate lead 348, Kelvin lead 350, source lead 352, and drain lead 364 extend from the mold compound.

Thus, semiconductor component 340 includes a III-N cascode switch in which the substrate of the III-N semiconductor material is electrically floating. Although semiconductor component 340 is shown as having bond pads not formed over active areas of semiconductor chips 10 and 50, this is not a limitation of the present invention. Bond pads may be formed over active areas of semiconductor chip 10, semiconductor chip 50, or both.

Figure 34:
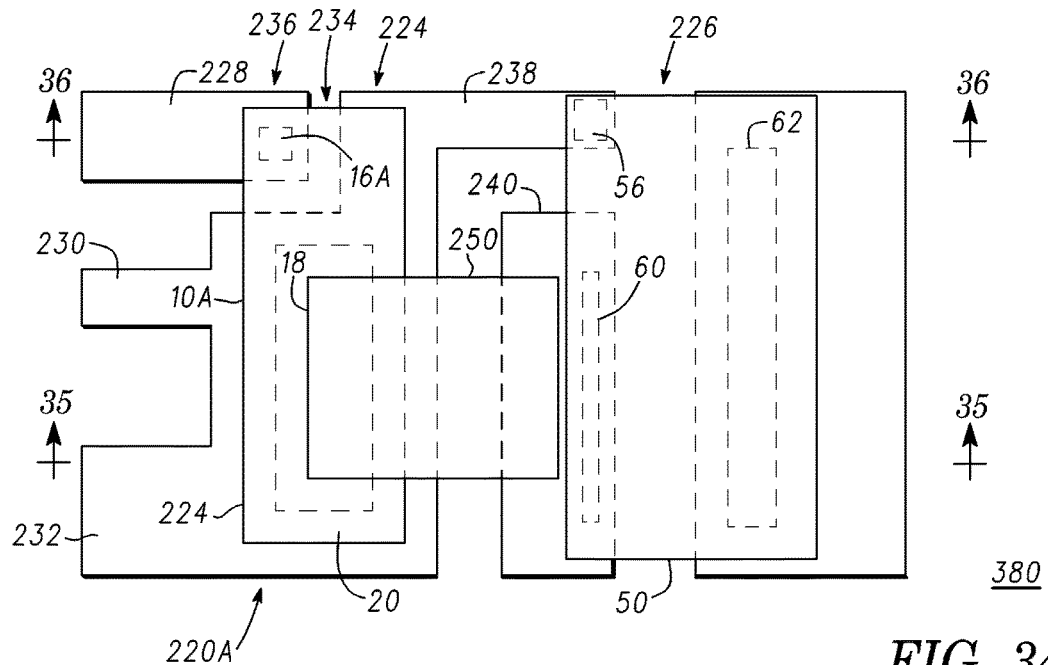
FIG. 34 is a top view of a cascode configured semiconductor component in accordance with another embodiment of the present invention.

FIG. 34 is a top view of a semiconductor component 380 comprising a support 220A that includes device receiving structures 224 and 226, a gate lead 228, a Kelvin lead 230, and a source lead 232. Device receiving structure 224 is a rectangularly shaped device receiving structure 224 having a notch 234 at one of its corners. Gate lead 228 has an end 236 that mates with notch 234 and an end that extends away from notch 234 of device receiving structure 224. End 236 is spaced apart and electrically isolated from device receiving structure 224, wherein end 236 is configured to mate with a bond pad. An extension 238 extends from a side of device receiving structure 224 that is opposite the side containing notch 234. Extension 238 in combination with device receiving structure 224 forms an L-shaped structure. Device receiving area 226 includes a rectangular shaped interconnect structure 240 that is spaced apart and electrically isolated from device receiving structure 224 and extension 238, i.e., the L-shaped structure. Device receiving area 226 further includes an electrically conductive body 242 having a surface 244 and configured for mating with a semiconductor chip. It should be noted that the top view of semiconductor component 380 looks the same as the top view of semiconductor component 220 described with reference to FIGS. 19-23. Support 220A is configured for packaging in a QFN package.

FIG. 34 further illustrates a semiconductor chip such as, for example semiconductor chip 10A (shown in FIG. 2) mounted to device receiving structure 224 of support 220A. Semiconductor chip 10A includes a gate bond pad 16A, a source bond pad 18, and a drain contact 20, wherein gate bond pad 16A and source bond pad 18 are shown as dashed lines because they are hidden from view by the body of semiconductor material of semiconductor chip 10A.

Gate lead 228 may be rectangularly shaped leads that are spaced apart from and electrically isolated from device receiving area 224, whereas Kelvin lead 230 and source lead 232 and device receiving area 224 are integrally formed with each other such that Kelvin lead 230 and source lead 232 extend from device receiving area 224. The shapes of leads 228, 230, and 232 are not limitations of the present invention.

A semiconductor chip 50 is mounted to device receiving structure 226 in a flip-chip configuration. Because semiconductor component 10A is in a flipped configuration and semiconductor component 50 is in a flipped configuration, semiconductor component 380 may be referred to as being in a flipped-flipped configuration. Semiconductor chips 10A and 50 have been described with reference to FIGS. 2 and 3, respectively. Gate bond pad 56 of semiconductor chip 50 are bonded to extension 238 and drain bond pad 62 is bonded to surface 244 of electrically conductive body 242, wherein electrically conductive body 242 serves as a drain contact area. Gate bond pad 56, source bond pad 60, and drain bond pad 62 are illustrated using dashed lines because semiconductor chip 50 is flipped such that bond pads 56, 60, and 62 face extension 238, interconnect structure 240, and drain contact area 242, respectively. It should be noted that the portions of extension 238, interconnect structure 240, and drain contact area 242 that are below semiconductor chip 50 are shown as dashed lines.

Drain contact 20 of semiconductor chip 10A is electrically connected to interconnect structure 240 by an electrically conductive clip 250.

Figure 35:
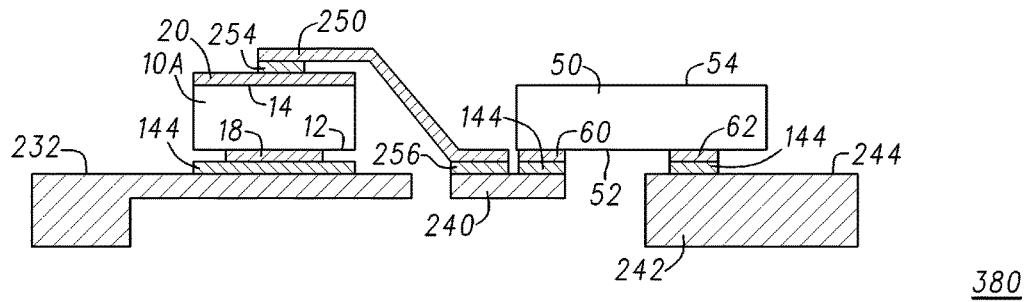
FIG. 35 is a cross-sectional view of the cascode configured semiconductor component of FIG. 34 taken along section line 35-35 of FIG. 34.
Figure 36:
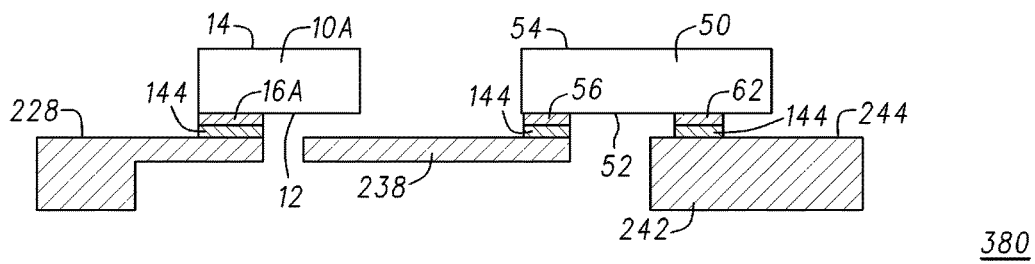
FIG. 36 is a cross-sectional view of the cascode configured semiconductor component of FIG. 35 taken along section line 36-36 of FIG. 35.

FIG. 35 is a cross-sectional view of semiconductor component 380 taken along section line 35-35 of FIG. 34 and FIG. 36 is a cross-sectional view of semiconductor component 380 taken along section line 36-36 of FIG. 34. Semiconductor component 380 differs from semiconductor component 220 in that mounting portion 132 and connector portion 134 of copper substrate 130 are absent, i.e., the copper substrate does not include mounting portion 132 and connector portion 134. In addition, insulating material 140 is absent. Support 220A includes device receiving structure 224, interconnect structure 240, and pedestal structure 242.

Semiconductor chip 10A is bonded to device receiving structure 224 using a bonding agent 114 such as, for example, solder. More particularly, source electrode 18 of semiconductor chip 10A is bonded to device receiving structure 224 by solder 144. Similarly, gate bond pad 16A of semiconductor chip 10A is bonded to gate lead 228 by bonding agent 144 and drain contact 20 is coupled to interconnect structure 240 by clip 250. More particularly, clip 250 has an end that is electrically connected to drain contact 20 through electrically conductive bonding agent 254 and the other end of clip 250 is electrically connected to interconnect structure through an electrically conductive bonding agent 256. By way of example, bonding agents 254 and 256 are solder. It should be noted that the bonding agent is not limited to being solder and that bonding agents 254 and 256 may be different materials.

Gate bond pad 56 of semiconductor chip 50 is bonded to a portion of extension 238 by solder 144, source bond pad 60 is bonded to interconnect structure 240 through solder 144, and drain bond pad 62 is bonded to a portion of drain contact area 242 by solder 144.

As those skilled in the art are aware, support 220A including device receiving structures 224 and 226, semiconductor chips 10A and 50, and clip 250 may be encapsulated in a protective material such as, for example a mold compound (not shown). It should be noted that after encapsulation, gate lead 108, Kelvin lead 110, and source lead 112 extend from the mold compound.

Thus, semiconductor component 380 includes a III-N cascode switch in which the substrate of the III-N semiconductor material is electrically floating. Although semiconductor component 380 is shown as having bond pads not formed over active areas of semiconductor chips 10A and 50, this is not a limitation. Bond pads may be formed over active areas of semiconductor chip 10A, semiconductor chip 50, or both.

Figure 37:
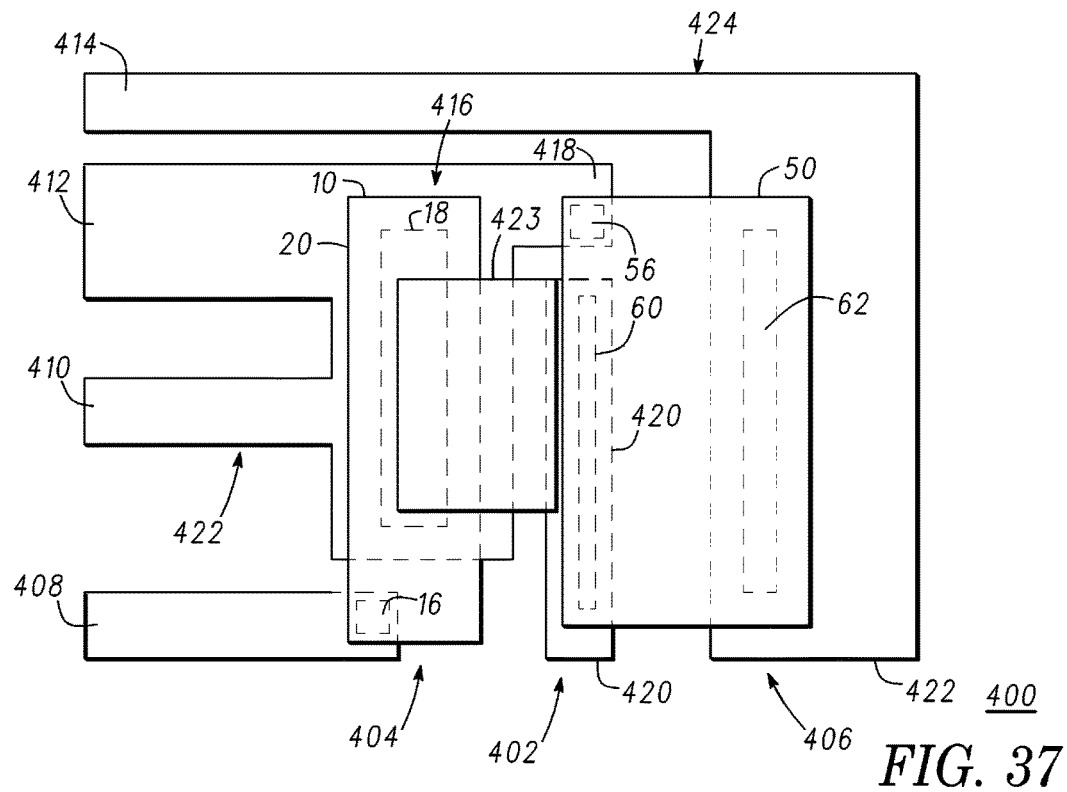
FIG. 37 is a top view of a cascode configured semiconductor component in accordance with another embodiment of the present invention.

FIG. 37 is a top view of a semiconductor component 400 comprising a support 402 that includes device receiving structures 404 and 406, a gate lead 408, a Kelvin lead 410, a source lead 412, a drain lead 414. Device receiving structure 404 is a rectangularly shaped electrically conductive pad having a device receiving area 416, a gate tab 418 extending from a first side, a source tab 412 extending from a first portion of a second side, the second side opposite the first side, and a Kelvin tab 410 extending from a second portion of the second side. Device receiving structure 406 includes a rectangularly shaped source interconnect pad 420 that is adjacent to and electrically isolated from device receiving area 416 and gate tab 418, and a drain contact structure 422. Drain contact structure 422 is connected to drain lead 414 via a drain interconnect 424. Support 402 conforms with through hole package outlines such as a TO-220 outline, a TO-247 outline, a TO-264 outline, a TO-257 outline, or the like.

FIG. 37 further illustrates a semiconductor chip such as, for example semiconductor chip 10 (shown in FIG. 1) mounted to device receiving structure 404 of support 402 and a semiconductor chip 50 mounted to device receiving structure 406. Gate bond pad 16 of semiconductor chip 10 is electrically connected to gate lead 408 and source bond pad 18 of semiconductor chip 10 is electrically connected to device receiving area 416. Drain bond pad 20 of semiconductor chip 10 is electrically connected to source interconnect pad 420 through a clip 423. Gate bond pad 56 of semiconductor chip 50 is electrically connected to gate tab 418 using, for example, solder. Source bond pad 60 of semiconductor chip 50 is electrically connected to source interconnect pad 420 using, for example, solder, and drain bond pad 62 of semiconductor chip 60 is electrically connected to drain contact structure 422 using, for example, solder. Gate bond pad 56, source bond pad 60, drain bond pad 62, a side of source interconnect pad, and a side of drain contact structure 422 are indicated by broken lines because semiconductor chip 50 is mounted to device receiving structure 346 in a flip-chip configuration and are therefore blocked from view by the body of semiconductor chip 50.

Thus, semiconductor component 400 includes a III-N cascode switch in which the substrate of the III-N semiconductor material is electrically floating. Although semiconductor component 400 is shown as having bond pads not formed over the active areas of semiconductor chips 10 and 50, i.e., absent from the active areas of semiconductor chips 10 and 50, this is not a limitation of the present invention. Bond pads may be formed over active areas of semiconductor chip 10, semiconductor chip 50, or both.

Figure 38:
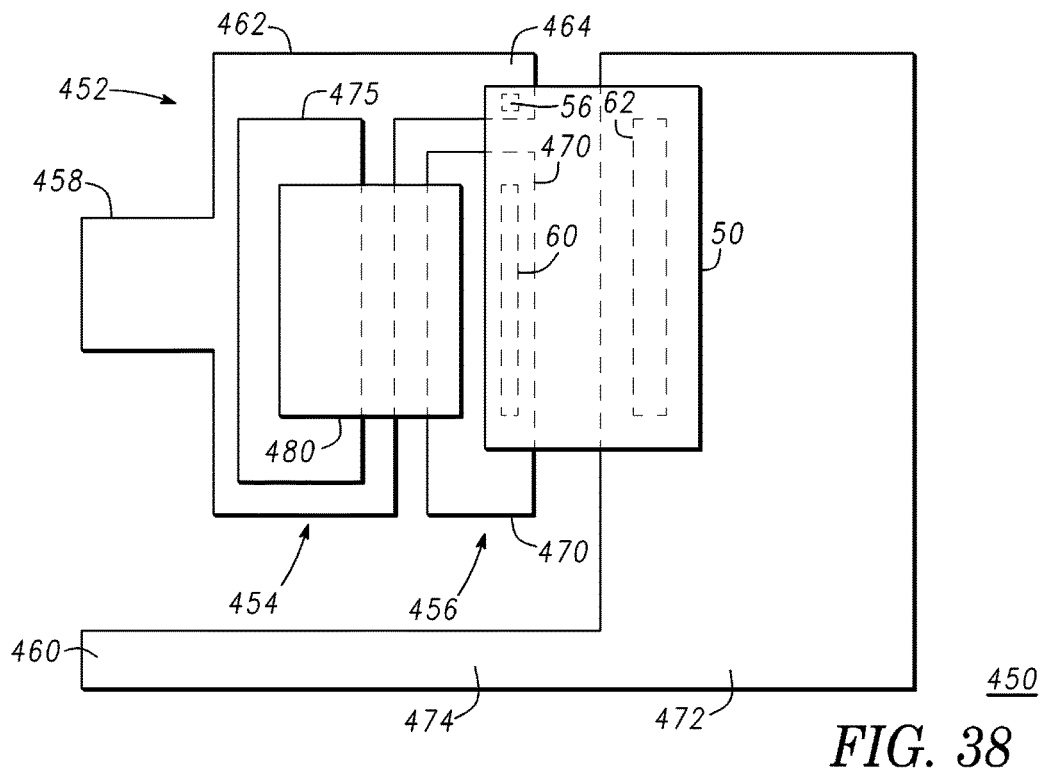
FIG. 38 is a top view of a cascode configured semiconductor component in accordance with another embodiment of the present invention.

FIG. 38 is a top view of a semiconductor component 450 comprising a support 452 that includes device receiving structures 454 and 456, an anode lead 458 and a cathode lead 460. Device receiving structure 454 is a rectangularly shaped electrically conductive pad having a device receiving area 462, a gate tab 464 extending from a first side of device receiving structure 462 and an anode tab or anode lead 458 extending from a second side of device receiving structure 462, wherein the second side of the device receiving area is opposite the first side of the device receiving area. Device receiving structure 456 includes a rectangularly shaped interconnect pad 470 that is adjacent to and electrically isolated from device receiving area 462 and gate tab 464, and a drain contact structure 472. Interconnect pad 470 may be referred to as a cathode interconnect pad, a source interconnect pad, or a cathode/source interconnect pad. Drain contact structure 472 is connected to cathode lead 460 via a cathode interconnect 474. Support 452 conforms with through hole package outlines such as a TO-220 outline, a TO-247 outline, a TO-264 outline, a TO-257 outline, or the like.

Figure 39:
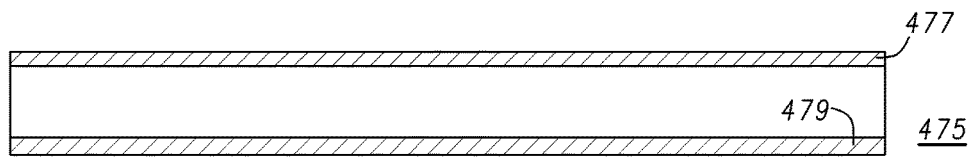
FIG. 39 is a cross-sectional view of a semiconductor chip suitable for use in manufacturing a cascode configured semiconductor component in accordance with an embodiment of the present invention.

Briefly referring to FIG. 39, a cross-sectional view of a semiconductor chip 475 comprising a diode is illustrated. The diode of semiconductor chip 475 has an anode contact 477 and a cathode contact 479.

Referring again to FIG. 38, semiconductor chip 475 is mounted to device receiving structure 454 of support 452 and a semiconductor chip 50 is mounted to device receiving structure 456. Anode contact 477 of semiconductor chip 475 is electrically connected to device receiving area 462. Gate bond pad 56 of semiconductor chip 50 is electrically connected to gate tab 464 using, for example, solder. Source bond pad 60 of semiconductor chip 50 is electrically connected to interconnect pad 470 using, for example, solder, and drain bond pad 62 of semiconductor chip 50 is electrically connected to gate contact 472 using, for example, solder. Gate bond pad 56, source bond pad 60, and drain bond pad 62, a side of anode interconnect pad 470, and a side of drain contact structure 472 are indicated by broken lines because semiconductor chip 50 is mounted to device receiving structure 456 in a flip-chip configuration and they are therefore blocked from view by the body of semiconductor chip 50.

The source of semiconductor chip 50 is electrically connected to interconnect pad 470 by a clip 480.

Thus, semiconductor component 450 includes a III-N cascode switch in which the substrate of the III-N semiconductor material is electrically floating. Although semiconductor component 450 is shown as having bond pads not formed over active areas of semiconductor chips 10 and 50, i.e., absent from the active areas, this is not a limitation of the present invention. Bond pads may be formed over active areas of semiconductor chip 475, semiconductor chip 50, or both.

FIG. 39 is a top view of a semiconductor component 500 comprising a support 502 that includes device receiving structures 504 and 506, and an anode lead 507. Device receiving structure 504 is a rectangularly shaped electrically conductive pad having a device receiving area 508 and a notch 510 at one of its corners. Thus, device receiving structure 504 is configured to have a rectangularly shaped device receiving area 508 having a notch 510 thereby forming a tab portion or structure 512 extending from one side. Device receiving structure 506 comprises a conductive interconnect 514 positioned in notch 510, a portion of tab structure 512 and an electrically conductive body 516 configured for mating with a drain bond pad 62 of a semiconductor chip 50. Thus, tab structure 512 is common to device receiving structures 504 and 506. Support 508 further includes a drain lead 518 extending from electrically conductive body 516. Electrically conductive body 516 and drain lead 518 are electrically isolated from device receiving structure 504. Support 502 conforms with through hole package outlines such as a TO-220 outline, a TO-247 outline, a TO-264 outline, a TO-257 outline, or the like.

Figure 40:
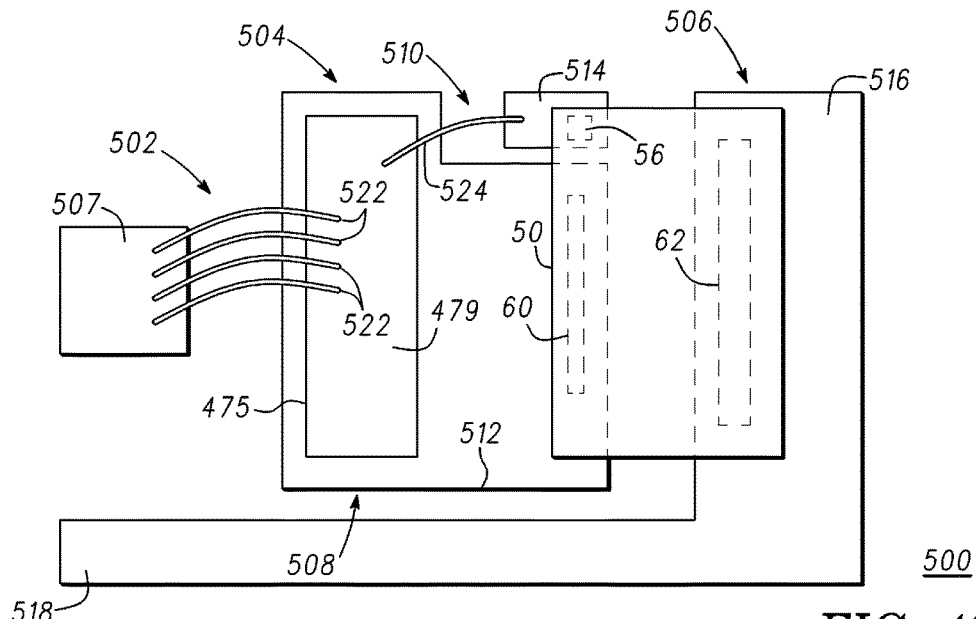
FIG. 40 is a top view of a cascode configured semiconductor component in accordance with another embodiment of the present invention.

FIG. 40 further illustrates a semiconductor chip such as, for example semiconductor chip 475 mounted to device receiving structure 504 of support 502 and a semiconductor chip 50 mounted to device receiving structure 506. An anode contact 477 is electrically connected to anode lead 507 by bond wires 522 and to conductive interconnect 514 by a bond wire 524. A cathode contact (shown in FIG. 39) is electrically connected to or bonded to device receiving area 504 by solder. Gate bond pad 56, source bond pad 60, and drain bond pad 62 are indicated by broken lines because semiconductor chip 50 is mounted to device receiving structure 506 in a flip-chip configuration and are therefore blocked from view by the body of semiconductor chip 50.

Anode lead 507 is a rectangularly shaped lead that is spaced apart and electrically isolated from device receiving structure 504. The shape of anode lead 507 is not a limitation of the present invention.

Figure 41:
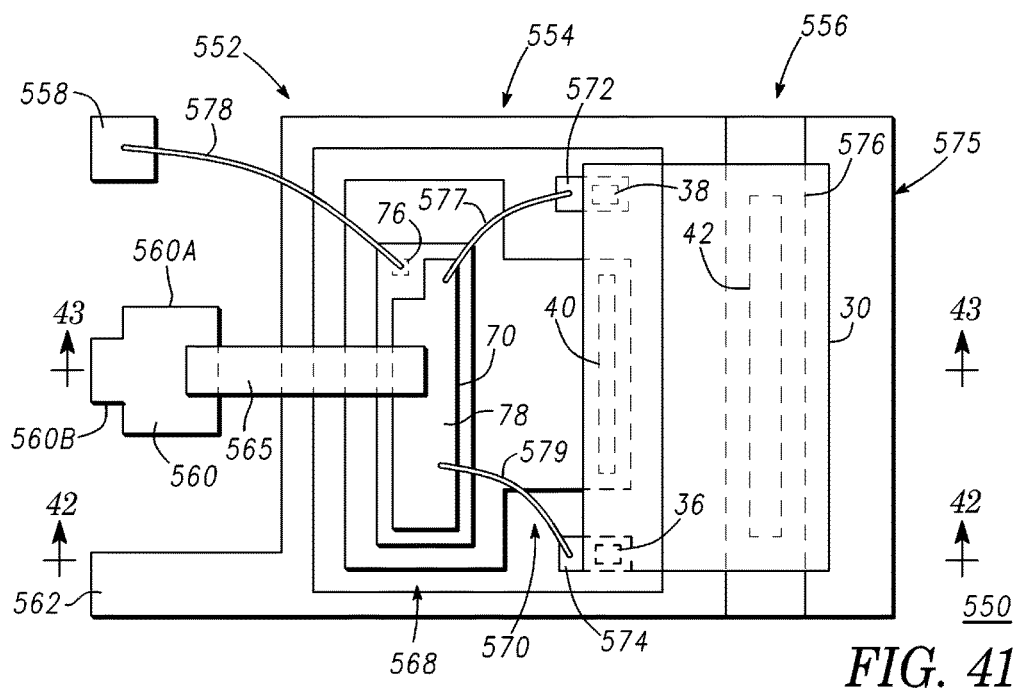
FIG. 41 is a top view of a cascode configured semiconductor component in accordance with another embodiment of the present invention.

FIG. 41 is a top view of a semiconductor component 550 comprising a support 552 that includes device receiving structures 554 and 556, a gate lead 558, a source lead 560, and a drain lead 562. Device receiving structure 554 includes a device receiving area 568 and a contact extension or tongue 570 and device receiving structure 556 includes interconnects 572 and 574, and drain contact region 575 having a drain contact area 576. Drain contact area 576 may be referred to as a pedestal, drain pedestal, or a drain contact pedestal. Contact extension 570 is common to device receiving structure 554 and device receiving structure 556. By way of example, device receiving area 568 is rectangularly shaped with a rectangularly shaped contact extension 570 extending therefrom. Interconnects 572 and 574 are formed laterally adjacent to and spaced apart from contact extension 570. Thus, interconnects 572 and 574 are electrically isolated from contact extension 570.

Gate lead 558 is a rectangularly shaped lead that is spaced apart and electrically isolated from device receiving structure 554, whereas drain lead 562 is a rectangularly shaped lead that extends from device receiving structure 554, i.e., drain lead 562 is integrally formed with device receiving structure 554. In an example, source lead 560 has a square shaped portion 560A and an extension 560B or tab extending from square shaped portion 560A.

FIG. 40 illustrates semiconductor component 550 after semiconductor chip 70 (shown in FIG. 4) has been attached to device receiving structure 554 in an upright orientation and after semiconductor chip 30 has been attached to device receiving structure 556 in a flip-chip configuration. The term attached to can be referred to as being bonded to, being mounted to, or the like. Because semiconductor component 70 is in an upright configuration or an unflipped configuration and semiconductor component 30 is in a flipped configuration, semiconductor component 550 may be referred to as being in an upright-flipped configuration. Semiconductor chips 70 and 30 have been described with reference to FIGS. 1 and 4, respectively. Gate bond pads 38 and 36 of semiconductor chip 30 are bonded to interconnects 572 and 574, respectively, and drain bond pad 42 is bonded to drain contact area 576. Gate bond pads 36 and 38, source bond pad 40, and drain bond pad 42 are illustrated using broken lines because semiconductor chip 30 is flipped and bond pads 36, 38, 40 and 42 face interconnects 572 and 574, contact extension 570, and drain contact area 576, respectively. It should be noted that the portions of contact extension 570 and drain contact area 576 that are below semiconductor chip 30 are shown as broken lines.

Gate bond pad 76 of semiconductor chip 70 is electrically connected to gate lead 558 by a bond wire 578, source bond pad 78 of semiconductor chip 70 is electrically connected to source lead 560 by a clip 565 and to source bond pads 38 and 36 through interconnects 572 and 574 by bond wires 577 and 579, respectively.

Figure 42:
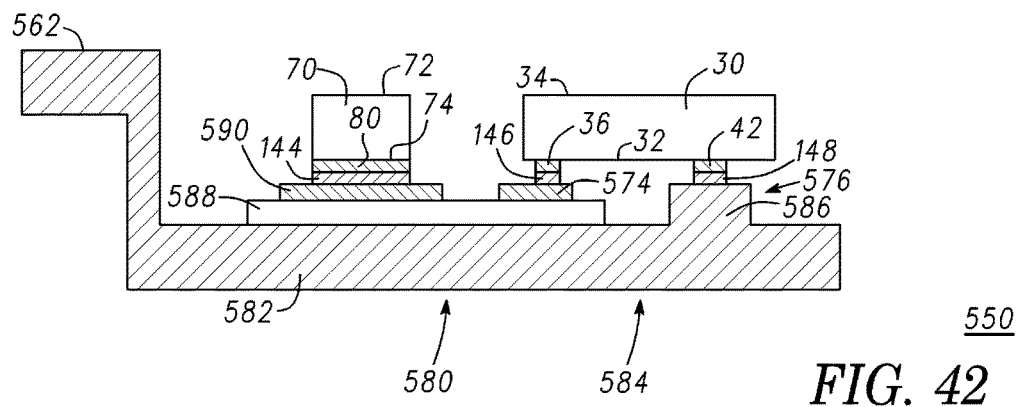
FIG. 42 is a cross-sectional view of the cascode configured semiconductor component of FIG. 41 taken along section line 42-42 of FIG. 41.
Figure 43:
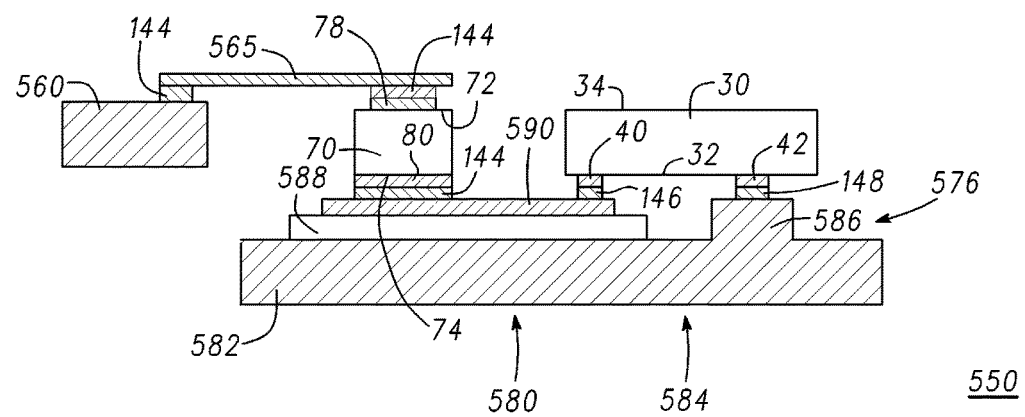
FIG. 43 is a cross-sectional view of the cascode configured semiconductor component of FIG. 41 taken along section line 43-43 of FIG. 41.

FIG. 42 is a cross-sectional view of semiconductor component 550 taken along section line 42-42 of FIG. 41 and FIG. 43 is a cross-sectional view of semiconductor component 550 taken along section line 43-43 of FIG. 41. For the sake of clarity, FIGS. 41, 42, and 43 are described together. In accordance with an embodiment, support 552 is an electrically conductive substrate 580 having a mounting portion 582, a connector portion 584, and a pedestal portion 586, where mounting portion 582 is connected to pedestal portion 586 through a connector portion 584. By way of example, electrically conductive substrate 580 comprises copper. Pedestal portion 586 is formed at an end of copper substrate 580 in drain contact region 576 and extends vertically to a level that is higher than does mounting portion 582. A layer of electrically insulating material 588 is formed on mounting portion 582 of copper substrate 580. A layer of electrically conductive material 590 is formed on layer of insulating material 588. By way of example, layer of electrically conductive material 590 is copper. Techniques for forming an insulating material on an electrically conductive substrate and for forming an electrically conductive material on an insulating material are known to those skilled in the art. Alternatively, a direct bonded copper support having at least two electrically conductive layers separated by a dielectric material may be bonded to mounting portion 582 rather than bonding dielectric layer 588 to substrate 580 and bonding electrically conductive material 590 to insulating material 588. A direct bonded copper support may be referred as an insulated metal substrate and insulating layer 588 may be referred to as a dielectric layer or an insulating material.

Semiconductor chip 70 is bonded to layer of electrically conductive material 590 using, for example, solder 144. More particularly, drain electrode 80 of semiconductor chip 70 is bonded to layer of electrically conductive material 590 by solder 144. Similarly, gate bond pad 36 of semiconductor chip 30 is bonded to a portion of layer of electrically conductive material 574 by solder 146 and drain bond pad 42 is bonded to a pedestal 586 by solder 148. An end of clip 565 is bonded to source electrode 78 by a bonding agent such as for example solder 144 an opposing end of clip 565 is bonded to mounting portion 582 by a bonding agent such as, for example, solder 144.

As those skilled in the art are aware, support 552 including device receiving structures 554 and 556, semiconductor chips 70 and 30, clip 580 and bond wires 577, 578, and 579 may be encapsulated in a protection material such as, for example a mold compound (not shown). It should be noted that after encapsulation, gate lead 558, source lead 560, and drain lead 562 extend from the mold compound.

Thus, semiconductor component 550 includes a III-N cascode switch in which the substrate of the III-N semiconductor material is electrically floating. Support 552 conforms with through hole package outlines such as a TO-220 outline, a TO-247 outline, a TO-264 outline, a TO-257 outline, or the like.

Figure 44:
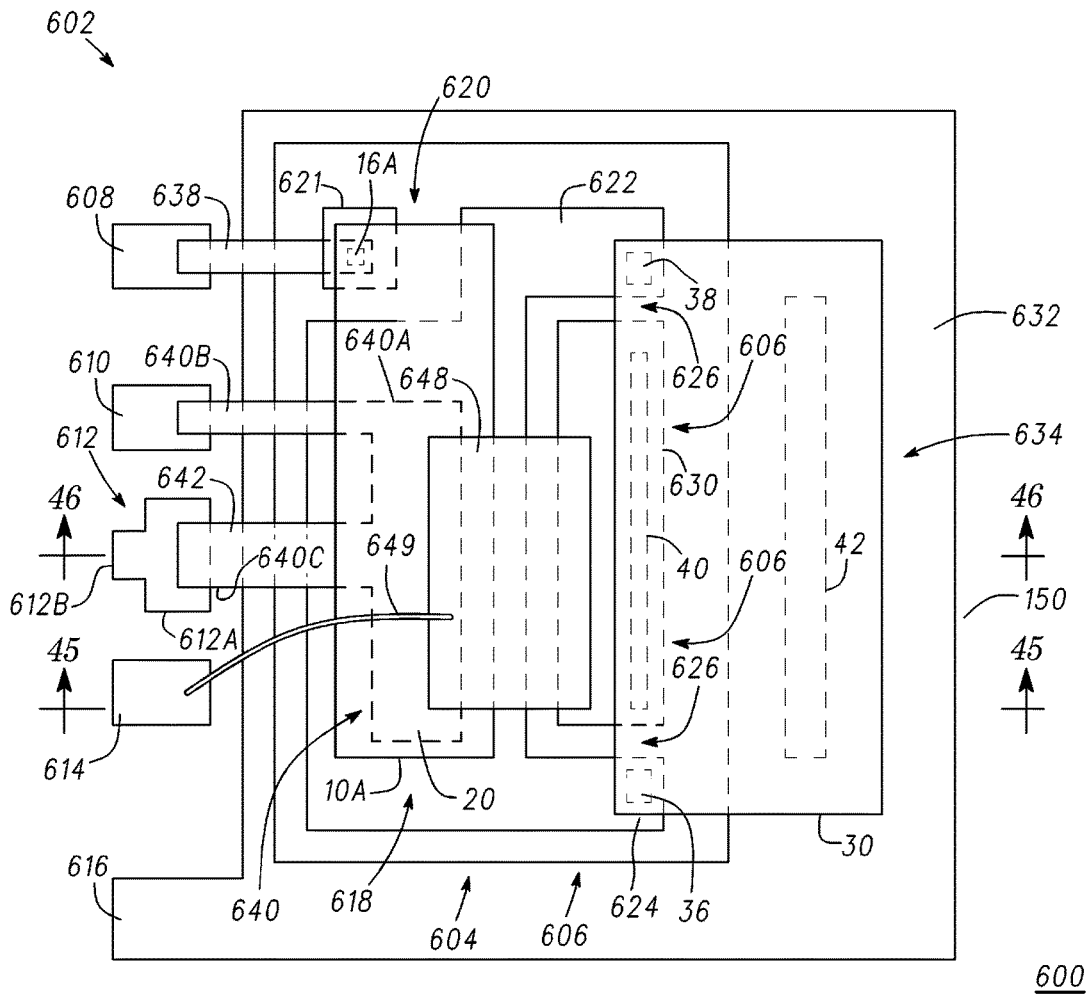
FIG. 44 is a top view of a cascode configured semiconductor component in accordance with another embodiment of the present invention.

FIG. 44 is a top view of a semiconductor component 600 comprising a support 602 that includes device receiving structures 604 and 606, a gate lead 608, a Kelvin lead 610, a source lead 612, a sense lead 614, and a drain lead 616. Device receiving structure 604 is a rectangularly shaped electrically conductive pad having a device receiving area 618 having a corner notch 620 at one of its corners, and an electrically conductive interconnect 621 positioned in notch 620. Device receiving structure 604 further includes interconnect extensions 622 and 624 extending from opposite sides of device receiving area 618 so that a side notch 626 is formed in device receiving structure 604. Device receiving structure 606 comprises an electrically conductive interconnect 630 positioned in notch 626, a portion of interconnect extension 622, a portion of interconnect extension 624, and an electrically conductive body 632 having a drain contact region 634 configured for mating with a drain bond pad 42 of a semiconductor chip 30. Thus, electrically conductive interconnect 630 is common to device receiving structures 604 and 606. Support 602 further includes a drain lead 616 extending from electrically conductive body 632. Electrically conductive body 632 and drain lead 616 are electrically isolated from device receiving structure 604.

Support 602 conforms with through hole package outlines such as a TO-220 outline, a TO-247 outline, a TO-264 outline, a TO-257 outline, or the like.

Figure 45:
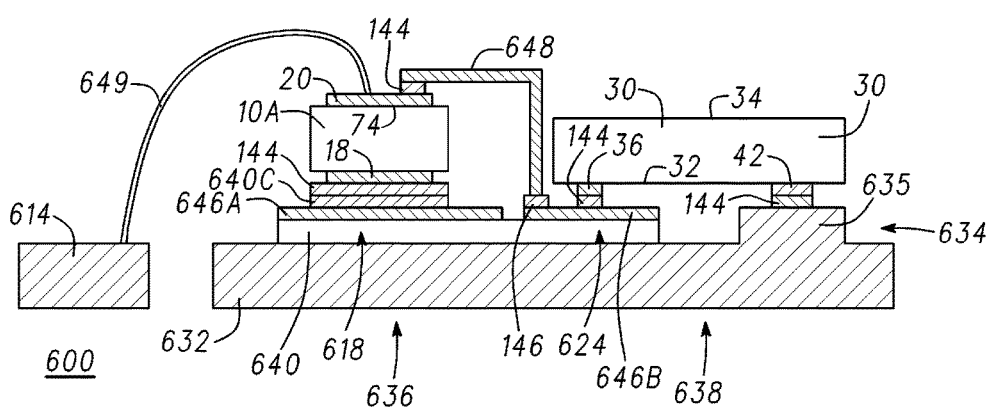
FIG. 45 is a cross-sectional view of the cascode configured semiconductor component of FIG. 44 taken along section line 45-45 of FIG. 44.
Figure 46:
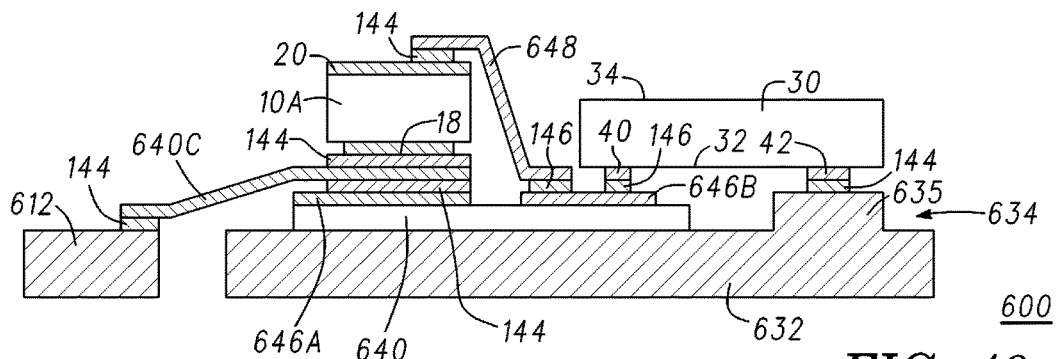
FIG. 46 is a cross-sectional view of the cascode configured semiconductor component of FIG. 44 taken along section line 46-46 of FIG. 44.

FIG. 44 further illustrates a semiconductor chip such as, for example semiconductor chip 10A (shown in FIG. 2) mounted to device receiving structure 604 of support 602 in a flipped orientation or configuration and a semiconductor chip 30 mounted to device receiving structure 606 in a flipped orientation or configuration. FIG. 45 is a cross-sectional view of semiconductor component 600 taken along section line 45-45 of FIG. 44. FIG. 46 is a cross-sectional view of semiconductor component 600 taken along section line 46-46 of FIG. 44. For the sake of clarity, FIGS. 44-46 are described together. In accordance with an embodiment, support 602 comprises an electrically conductive substrate 632 having a mounting portion 636, a connector portion 638, and a pedestal portion 635, where mounting portion 636 is connected to pedestal portion 635 through a connector portion 638. By way of example, electrically conductive substrate 632 comprises copper. Pedestal portion 635 is formed at an end of copper substrate 632 in drain contact region 634 and extends vertically to a level that is higher than does mounting portion 636. A layer of electrically insulating material 640 is formed on mounting portion 636 of copper substrate 632. Layers of electrically conductive material 646A and 646B are formed on portions of layer of insulating material 640. By way of example, layers of electrically conductive material 646A and 646B are copper. Electrically conductive layers 646A and 646B serve portions of device receiving area 618. Techniques for forming an insulating material on an electrically conductive substrate and for forming an electrically conductive material on an insulating material are known to those skilled in the art. Alternatively, a direct bonded copper support having at least two electrically conductive layers separated by a dielectric material may be bonded to mounting portion 636 rather than bonding dielectric layer 640 to substrate 632 and bonding electrically conductive material 646A and 646B to insulating material 640. A direct bonded copper support may be referred to as an insulated metal substrate and insulating layer 640 may be referred to as a dielectric layer or an insulating material.

Electrically conductive interconnect 621 is electrically connected to gate lead 608 by an electrically conductive clip 638, which has an end bonded to gate lead 608 by a bonding agent such as, for example, solder, and an end bonded to electrically conductive interconnect 621 by a bonding agent such as, for example, solder. Layer of electrically conductive material 646A is electrically connected to Kelvin lead 610 by an electrically conductive clip 640, which clip 640 has a body 640A, an extension 640B, and an extension 640C. Body 640A is bonded to electrically conductive layer 646A by a bonding agent such as, for example, solder, and an extension 640B is bonded to Kelvin lead 610 by a bonding agent such as, for example, solder. Source lead 612 is electrically connected to source bond pad 18 and electrically conductive layer 646A by an electrically conductive clip 640, where body 640A is bonded to electrically conductive layer 646A by a bonding agent such as, for example, solder and extension 640C is electrically connected to source lead 612 by a bonding agent 144 such as, for example, solder.

Gate bond pad 16A is electrically connected to electrically conductive clip 638 using a bonding agent 144 such as, for example, solder. Gate bond pads 36 and 38, source bond pad 40, and drain bond pad 42 are indicated by broken lines because semiconductor chip 30 is mounted to device receiving structure 606 in a flip-chip configuration and are therefore blocked from view by the body of semiconductor chip 30.

By way of example, gate lead 608, Kelvin lead 610, and sense lead 614 are rectangularly shaped leads that are spaced apart from and electrically isolated from device receiving structure 602 and source lead 612 has a square shaped portion 612A and an extension 612B extending square shaped portion 612A.

FIGS. 45 and 46 illustrate sense lead 614, device receiving area 618, interconnect extension 624, and electrically conductive body 632 of device receiving structure 606. Semiconductor chip 10A is bonded to device receiving structure 604 using, for example, solder 144. More particularly, source bond pad 18 of semiconductor chip 10A is bonded to electrically conductive layer 646A by solder 144. Drain electrode 20 is electrically connected to electrically conductive layer 646B by a clip 648, wherein clip 648 has an end bonded to drain electrode 20 by a bonding agent 144 and an end bonded to electrically conductive layer 646B by a bonding agent 146. By way of example bonding agent 144 and 146 are solder. It should be noted that bonding agent 144 and 146 can be the same bonding agent or different bonding agents from each other. Bond wire 649 electrically couples sense lead 614 to clip 648. Drain contact 20 of semiconductor chip 10A is shown in FIG. 44.

Gate bond pads 36 and 38 of semiconductor chip 30 are bonded to a interconnect extensions 622 and 624, respectively by bonding agent 144, source bond pad 40 is bonded to electrically conductive interconnect 630 through bonding agent 144, and drain bond pad 62 is bonded to a portion of electrically conductive body 362 that serves as a drain contact area by bonding agent 144.

As those skilled in the art are aware, support 602 including device receiving structures 604 and 606, semiconductor chips 10A and 30, clips 638, 649, and 642, and bond wire 649 may be encapsulated in a protection material such as, for example a mold compound (not shown). It should be noted that after encapsulation, gate lead 608, Kelvin lead 610, source lead 612, sense lead 614, and drain lead 616 extend from the mold compound.

Thus, semiconductor component 600 includes a III-N cascode switch in which the substrate of the III-N semiconductor material is electrically floating. Although semiconductor component 600 is shown as having bond pads not formed over active areas of semiconductor chips 10A and 30, i.e., not over active areas of semiconductor chips 10A and 30, this is not a limitation of the present invention. Bond pads may be formed over active areas of semiconductor chip 10A, semiconductor chip 30, or both.

Figure 47:
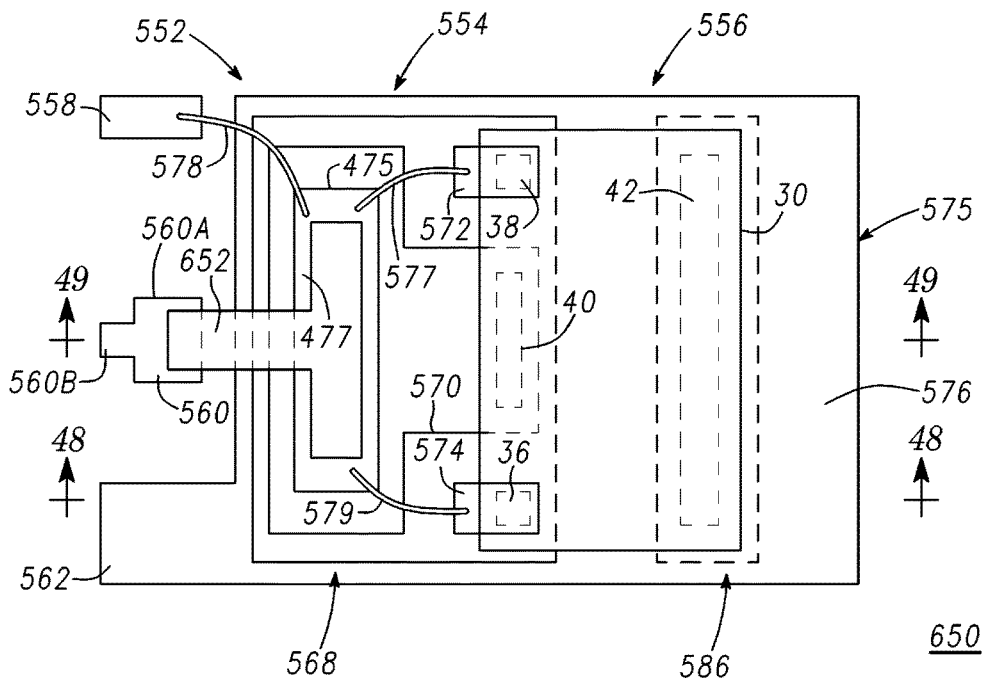
FIG. 47 is a top view of a cascode configured semiconductor component in accordance with another embodiment of the present invention.

FIG. 47 is a top view of a semiconductor component 650 comprising a support 552 that includes device receiving structures 554 and 556, a sense lead 558, an anode lead 560, and a cathode lead 562. It should be noted that the support 552 of semiconductor component 650 is the same as support 552 of semiconductor component 550, except that lead 558 is used as a sense lead rather than a gate lead, lead 560 is used as an anode lead rather than a source lead, and lead 562 is used as a cathode lead rather than a drain lead. Thus, reference characters 558, 560, and 562 identifying the leads have been preserved. Device receiving structure 554 includes a device receiving area 568 and a contact extension or tongue 570 and device receiving structure 556 includes interconnects 572 and 574, and drain contact region 575 having a drain contact area 576. Drain contact area 576 may be referred to as a pedestal, drain pedestal, or a drain contact pedestal. Thus, contact extension 570 is common to device receiving structure 554 and device receiving structure 556. By way of example, device receiving area 568 is rectangularly shaped with a rectangularly shaped contact extension 570 extending therefrom. Interconnects 572 and 574 are formed laterally adjacent to and spaced apart from contact extension 570. Thus, interconnects 572 and 574 are electrically isolated from contact extension 570.

Support 552 conforms with through hole package outlines such as a TO-220 outline, a TO-247 outline, a TO-264 outline, a TO-257 outline, or the like.

Sense lead 558 is a rectangularly shaped lead that is spaced apart and electrically isolated from device receiving structure 554, whereas cathode lead 562 is a rectangularly shaped lead that extends from device receiving structure 554, i.e., cathode lead 562 is integrally formed with device receiving structure 554. Anode lead 560 has a square shaped portion 560A and an extension 560B extending square shaped portion 560A.

FIG. 47 illustrates semiconductor component 650 after semiconductor chip 475 has been attached to device receiving structure 554 and after semiconductor chip 30 has been attached to device receiving structure 556 in a flip-chip configuration. Semiconductor chip 475 has been described with reference to FIG. 39. The term attached to can be referred to as being bonded to, being mounted to, or the like. Because semiconductor component 30 is in a flipped configuration, semiconductor component 650 may be referred to as being in a flipped configuration. Semiconductor chip 30 has been described with reference to FIG. 3. Gate bond pads 38 and 36 of semiconductor chip 30 are bonded to interconnects 572 and 574, respectively, and drain bond pad 42 is bonded to drain contact area 576. Gate bond pads 36 and 38, source bond pad 40, and drain bond pad 42 are illustrated using broken lines because semiconductor chip 30 is flipped and hidden from view and bond pads 36, 38, 40 and 42 face interconnects 572 and 574, contact extension 570, and drain contact area 576, respectively. It should be noted that the portions of contact extension 570 and drain contact area 576 that are below semiconductor chip 30 or hidden from view by semiconductor chip 30 are shown as broken lines.

Cathode contact 479 of semiconductor chip 475 is electrically connected to sense lead 558 by a bond wire 578 and anode contact 477 of semiconductor chip 475 is electrically connected to anode lead 560 by a clip 652 and to interconnects 572 and 574 by bond wires 577 and 579, respectively.

Figure 48:
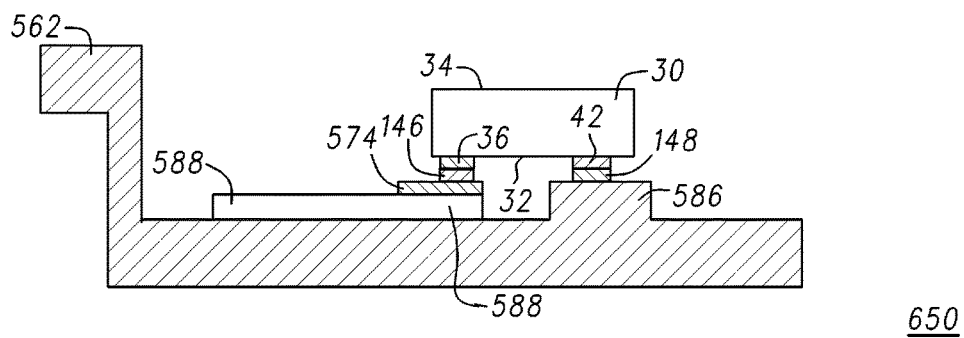
FIG. 48 is a cross-sectional view of the cascode configured semiconductor component of FIG. 47 taken along section line 48-48 of FIG. 47.
Figure 49:
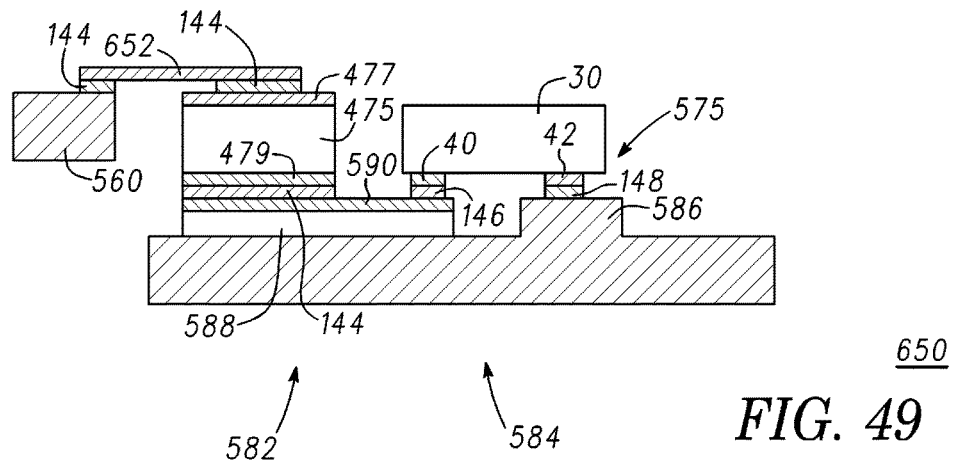
FIG. 49 is a cross-sectional view of the cascode configured semiconductor component of FIG. 47 taken along section line 49-49 of FIG. 47.

FIG. 48 is a cross-sectional view of semiconductor component 550 taken along section line 48-48 of FIG. 47 and FIG. 49 is a cross-sectional view of semiconductor component 650 taken along section line 49-49 of FIG. 47. For the sake of clarity, FIGS. 47-49 are described together. Support 552 has been described with reference to FIGS. 41-43. Semiconductor chip 475 is bonded to layer of electrically conductive material 590 using, for example, solder 144. More particularly, cathode contact 479 of semiconductor chip 475 is bonded to layer of electrically conductive material 590 by solder 144 and anode contact 477 is electrically coupled to anode lead 560 by a clip 652, where clip 652 has an end bonded to anode lead 560 by a bonding agent 144 and an end bonded to anode contact 477 by a bonding agent 144. Similarly, gate bond pad 36 of semiconductor chip 30 is bonded to a portion of layer of electrically conductive material 574 by solder 146 and drain bond pad 42 is bonded to a pedestal 586 by solder 148. By way of example, bonding agent 144, 146, and 148 are solder.

As those skilled in the art are aware, support 552 including device receiving structures 554 and 556, semiconductor chips 475 and 30, clip 652 and bond wires 577, 578, and 579 may be encapsulated in a protection material such as, for example a mold compound (not shown). It should be noted that after encapsulation, sense lead 558, anode lead 560, and cathode lead 562 extend from the mold compound.

Thus, semiconductor component 650 includes a III-N cascode switch in which the substrate of the III-N semiconductor material is electrically floating and bond pads are not formed over active regions of semiconductor component 550.

Figure 50:
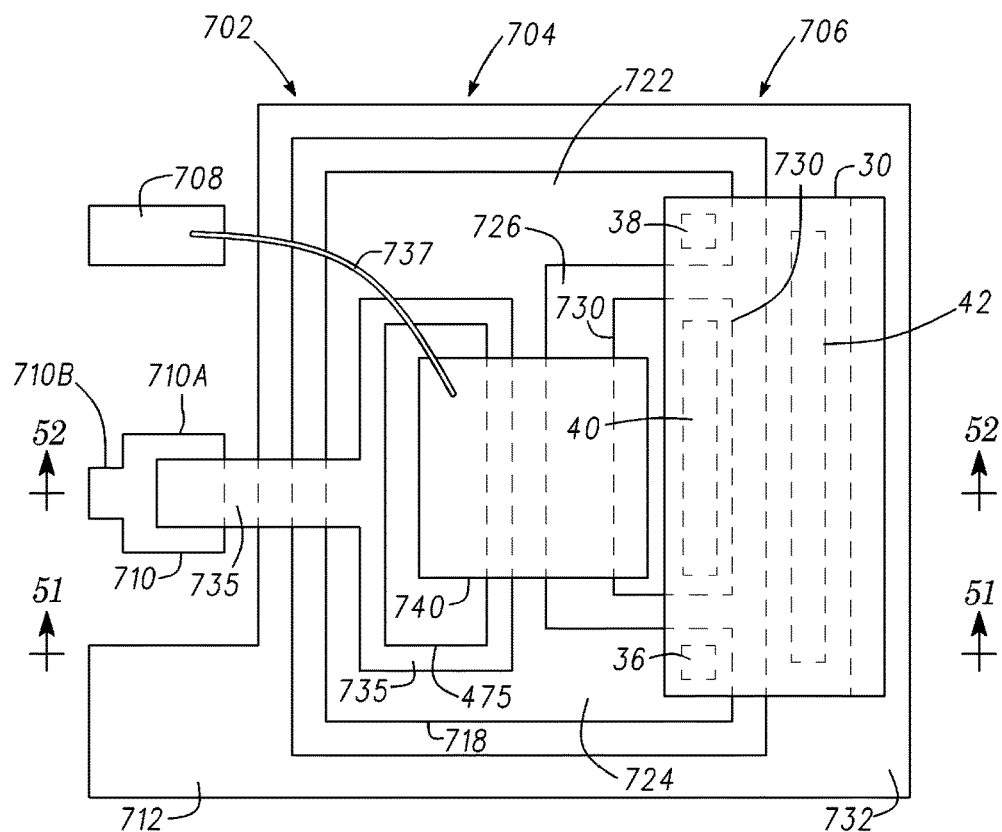
FIG. 50 is a top view of a cascode configured semiconductor component in accordance with another embodiment of the present invention.

FIG. 50 is a top view of a semiconductor component 700 comprising a support 702 that includes device receiving structures 704 and 706, a sense lead 708, an anode lead 710, and a cathode lead 712. Anode lead 710 has a square shaped portion 710A and an extension 710B extending from square shaped portion 710A. Device receiving structure 704 is a rectangularly shaped electrically conductive pad having a device receiving area 718. Interconnect extensions 722 and 724 extend from opposite sides of device receiving area 718 so that a side notch 726 is formed in device receiving structure 704. Device receiving structure 706 comprises an electrically conductive interconnect 730 positioned in notch 726, a portion of interconnect extension 722, a portion of interconnect extension 724, and an electrically conductive body 732 having a drain contact region 734 configured for mating with a drain bond pad 42 of a semiconductor chip 30. Thus, electrically conductive interconnect 730 is common to device receiving structures 704 and 706. Support 702 further includes a cathode lead 712 extending from electrically conductive body 732. Electrically conductive body 732 and cathode lead 712 are electrically isolated from device receiving structure 704.

Support 702 conforms with through hole package outlines such as a TO-220 outline, a TO-247 outline, a TO-264 outline, a TO-257 outline, or the like.

FIG. 50 further illustrates an electrically conductive clip 735 electrically connecting anode lead 710 to device receiving structure 704. A semiconductor chip such as, for example, semiconductor chip 475 described with reference to FIG. 39 is mounted to electrically conductive clip 735 such that anode contact 477 is bonded to one end of an electrically conductive clip 735 by a bonding agent 144 and the other end of electrically conductive clip 735 is bonded to anode lead 710 using bonding agent 144. An electrically conductive clip 740 connects a cathode contact 479 of semiconductor chip 475 to electrically conductive interconnect 730, wherein clip 740 has an end bonded to cathode contact 479 by a bonding agent such as, for example, solder, and an end bonded to electrically conductive interconnect 746B by a bonding agent 144 such as, for example, solder. A bond wire 737 is connected between sense lead 708 and electrically conductive clip 740. A semiconductor chip 30 is mounted to device receiving structure 706, such that a source bond pad 40 is bonded or coupled to electrically conductive interconnect 746B through bonding agent 144 and a drain bond pad is bonded or coupled to a pedestal portion 735 through bonding agent 144.

Figure 51:
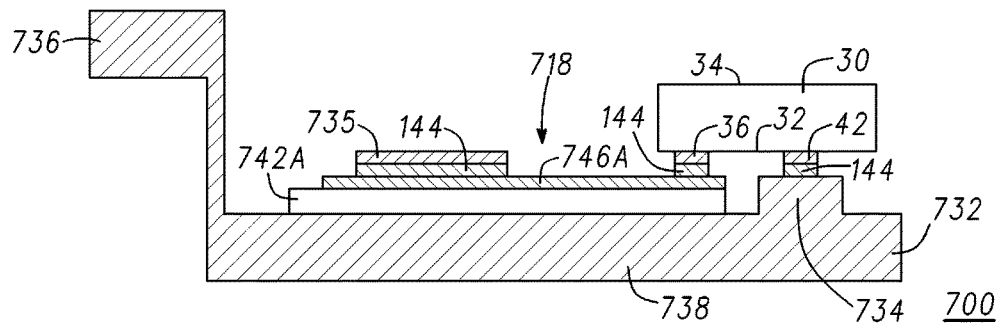
FIG. 51 is a cross-sectional view of the cascode configured semiconductor component of FIG. 50 taken along section line 51-51 of FIG. 50.
Figure 52:
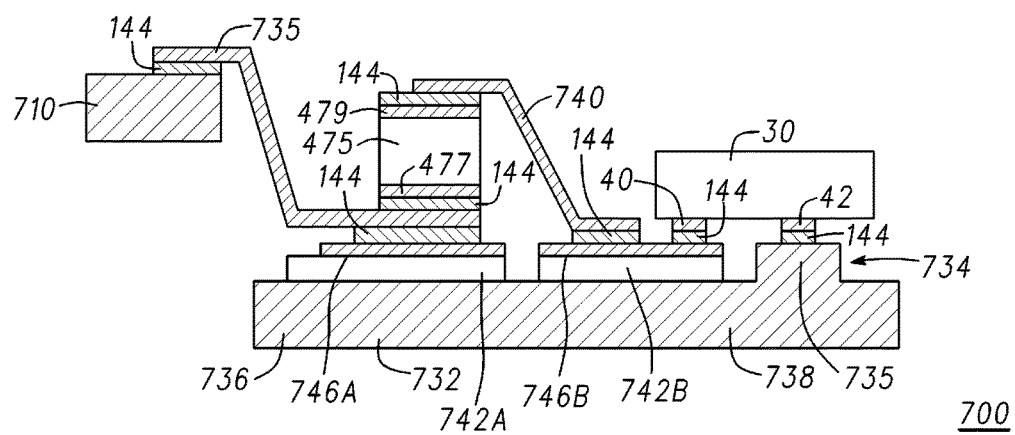
FIG. 52 is a cross-sectional view of the cascode configured semiconductor component of FIG. 50 taken along section line 52-52 of FIG. 50.

FIG. 51 is a cross-sectional view of semiconductor component 700 taken along section line 51-51 of FIG. 50. FIG. 52 is a cross-sectional view of semiconductor component 700 taken along section line 52-52 of FIG. 50. For the sake of clarity, FIGS. 50-52 are described together. In accordance with an embodiment, support 702 comprises an electrically conductive substrate 732 having a mounting portion 736, a connector portion 738, and a pedestal portion 735, where mounting portion 736 is connected to pedestal portion 735 through connector portion 738. By way of example, electrically conductive substrate 732 comprises copper. Pedestal portion 735 is formed at an end of copper substrate 732 in drain contact region 734 and extends vertically to a level that is higher than does mounting portion 736. Layers of electrically insulating material 742A and 742B are formed on mounting portion 736 of copper substrate 732. Layers of electrically conductive material 746A and 746B are formed on portions of layers of insulating material 740A and 742B, respectively. By way of example, layers of electrically conductive material 746A and 746B are copper. Electrically conductive layers 746A and 746B serve as portions of device receiving area 718. Techniques for forming an insulating material on an electrically conductive substrate and for forming an electrically conductive material on an insulating material are known to those skilled in the art. Alternatively, a direct bonded copper support having at least two electrically conductive layers separated by a dielectric material may be bonded to mounting portion 736 rather than bonding dielectric layers 742A and 742B to substrate 732 and bonding electrically conductive material 746A and 746B to layers 742A and 742B, respectively. A direct bonded copper support may be referred to as an insulated metal substrate and insulating layers 742A and 742B may be referred to as a dielectric layer or an insulating material.

Sense lead 708 is electrically connected to cathode 479 by a bond wire 737, and anode lead 710 is electrically connected to electrically conductive layer 746 by an electrically conductive clip 735, which electrically conductive clip 735 has an end bonded to anode lead 710 by a bonding agent 144 such as, for example, solder, and an end bonded to electrically conductive material 746 by bonding agent 144.

Sense lead 708 may be a rectangularly shaped lead whereas anode lead 710 has a rectangularly shaped portion 710A and an extension or tab 710B extending from rectangularly shaped portion 710A. Sense lead 708 and anode lead 710 are spaced apart from and electrically isolated from device receiving structure 702.

Semiconductor chip 475 is bonded to clip 735 using a bonding agent 144 such as, for example, solder 144. More particularly, anode contact 477 of semiconductor chip 475 is bonded to clip 435 by solder 144. Clip 740 electrically connects cathode contact 479 to electrically conductive interconnect 746B, wherein clip 740 has an end bonded to cathode contact 479 and an end bonded to electrically conductive interconnect 746B by a bonding agent such as, for example, solder 144. Electrically conductive interconnect 746A and electrically conductive interconnect 746B may be referred to as electrical interconnects.

Gate bond pads 36 and 38 of semiconductor chip 30 are bonded to interconnect extensions 722 and 724, respectively, by solder 146, source bond pad 40 is bonded to electrical interconnect 746B by bonding agent 144. Thus, source bond pad 40 is electrically connected to cathode contact 479 through electrical interconnect 746B and electrically conductive clip 740. Drain bond pad 42 is bonded to a pedestal portion 735 that of a drain contact area 734 by bonding agent 144.

As those skilled in the art are aware, support 702 including device receiving structures 704 and 706, semiconductor chips 475 and 30, clips 735 and 740, and bond wire 737 may be encapsulated in a protection material such as, for example a mold compound (not shown). It should be noted that after encapsulation, sense lead 708, anode lead 710, and cathode lead 712 extend from the mold compound.

Thus, semiconductor component 700 includes a III-N cascode switch in which the substrate of the III-N semiconductor material is electrically floating. Although semiconductor component 700 is shown as having bond pads not formed over active areas of semiconductor chip 30, i.e., absent from the active areas, this is not a limitation of the present invention. Bond pads may be formed over active areas semiconductor chip 30, or both.

Figure 53:
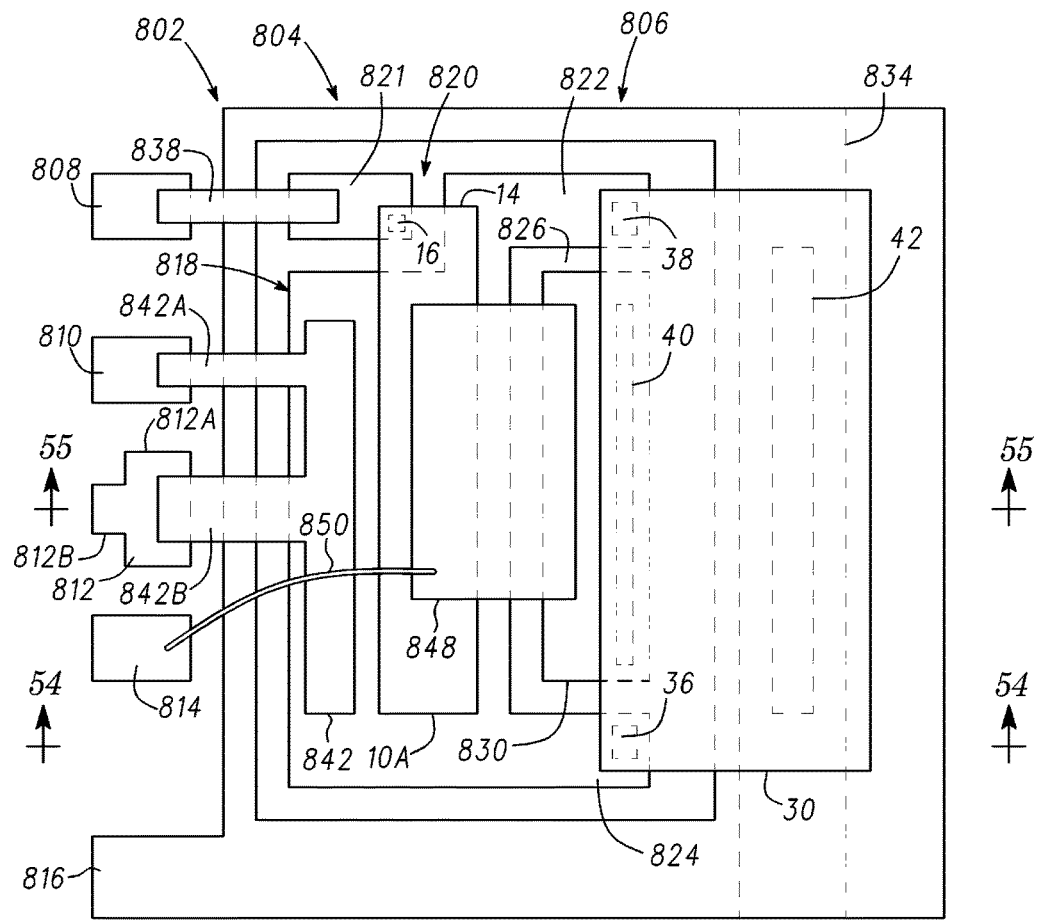
FIG. 53 is a top view of a cascode configured semiconductor component in accordance with another embodiment of the present invention.

FIG. 53 is a top view of a semiconductor component 800 comprising a support 802 that includes device receiving structures 804 and 806, a gate lead 808, a Kelvin lead 810, a source lead 812, a sense lead 814, and a drain lead 816. Device receiving structure 804 is a rectangularly shaped electrically conductive pad having a device receiving area 818 having a corner notch 820 at one of its corners, and an electrically conductive interconnect 821 positioned in notch 820. Device receiving structure 804 further includes interconnect extensions 822 and 824 extending from opposite sides of device receiving area 818 so that a side notch 826 is formed in device receiving structure 804. Device receiving structure 806 comprises an electrically conductive interconnect 830 positioned in notch 826, a portion of interconnect extension 822, a portion of interconnect extension 824, and an electrically conductive body 832 having a drain contact region 834 configured for mating with a drain bond pad 42 of a semiconductor chip 30. Thus, electrically conductive interconnect 830 is common to device receiving structures 804 and 806. Support 802 further includes a drain lead 816 extending from electrically conductive body 832. Electrically conductive body 832 and drain lead 816 are electrically isolated from device receiving structure 804.

Support 802 conforms with through hole package outlines such as a TO-220 outline, a TO-247 outline, a TO-264 outline, a TO-257 outline, or the like.

FIG. 53 further illustrates a semiconductor chip such as, for example semiconductor chip 10A (shown in FIG. 2) mounted to device receiving structure 804 of support 802 and a semiconductor chip 30 mounted to device receiving structure 806.

Figure 54:
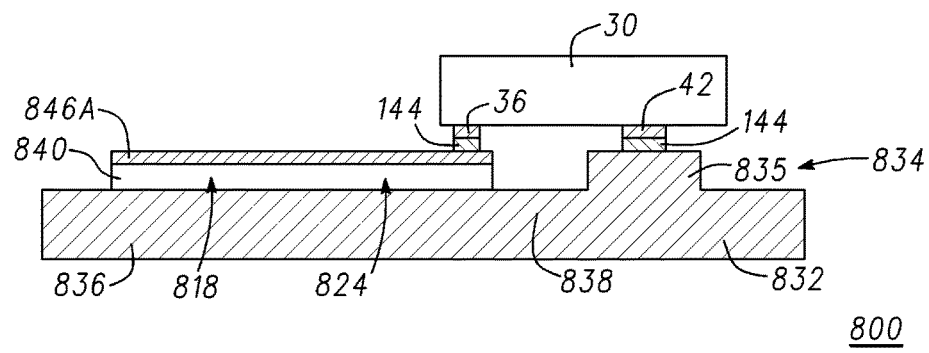
FIG. 54 is a cross-sectional view of the cascode configured semiconductor component of FIG. 53 taken along section line 54-54 of FIG. 53.
Figure 55:
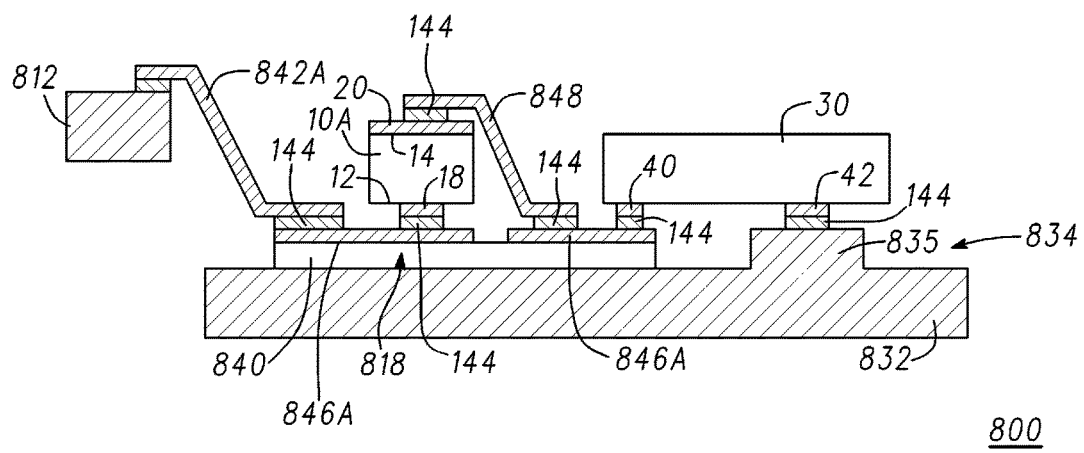
FIG. 55 is a cross-sectional view of the cascode configured semiconductor component of FIG. 53 taken along section line 55-55 of FIG. 53.

FIG. 54 is a cross-sectional view of semiconductor component 800 taken along section line 54-54 of FIG. 53. FIG. 55 is a cross-sectional view of semiconductor component 800 taken along section line 55-55 of FIG. 53. For the sake of clarity, FIGS. 53-55 are described together. In accordance with an embodiment, support 802 comprises an electrically conductive substrate 832 having a mounting portion 836, a connector portion 738, and a pedestal portion 735, where mounting portion 736 is connected to pedestal portion 835 through connector portion 838. By way of example, electrically conductive substrate 832 comprises copper. Pedestal portion 835 is formed at an end of copper substrate 832 in drain contact region 834 and extends vertically to a level that is higher than does mounting portion 836. A layer of electrically insulating material 840 is formed on mounting portion 836 of copper substrate 832. Layers of electrically conductive material 846A and 846B are formed on portions of layer of insulating material 840A. By way of example, layers of electrically conductive material 846A and 846B are copper. Electrically conductive layers 846A and 846B serve as portions of device receiving area 818. Techniques for forming an insulating material on an electrically conductive substrate and for forming an electrically conductive material on an insulating material are known to those skilled in the art. Alternatively, a direct bonded copper support having at least two electrically conductive layers separated by a dielectric material may be bonded to mounting portion 836 rather than bonding dielectric layers 840 to substrate 832 and bonding electrically conductive material 846A and 846B to layer 840. A direct bonded copper support may be referred to as an insulated metal substrate and insulating layer 840A may be referred to as a dielectric layer or an insulating material.

Electrically conductive interconnect 821 is electrically connected to gate lead 808 by an electrically conductive clip 838, which has an end bonded to gate lead 808 by a bonding agent such as, for example, solder and an end bonded to electrically conductive interconnect 821 by a bonding agent 144 such as, for example, solder. Layer of electrically conductive material 846A is electrically connected to Kelvin lead 810 by an electrically conductive clip 840, which clip 840 has a portion bonded to electrically conductive layer 846A by a bonding agent 144 such as, for example, solder, and a portion bonded to Kelvin lead 810 by a bonding agent 144 such as, for example, solder. Electrically conductive layer 846A may be referred to as an electrical interconnect, an interconnect, or an electrically conductive interconnect. Electrically conductive layer 846A is also electrically connected to source lead 812 by electrically conductive clip 842, which electrically conductive clip 842 has a portion bonded to electrically conductive material 846 by a bonding agent such as, for example, solder. In accordance with an embodiment, electrically conductive clip 842 is a unitary structure having an extension 842A and an extension 842B. Extension 842A is electrically coupled to Kelvin lead 810 by a bonding agent and extension 842B is electrically coupled to source lead 812 by a bonding agent.

Semiconductor chip 10 is bonded to device receiving structure 804 using a bonding agent such as, for example, solder 144. More particularly, source bond pad 18 of semiconductor chip 10 is bonded to device receiving structure 804 by solder 144. Drain contact 20 of semiconductor chip 10 is electrically coupled to electrically conductive interconnect 846B by a clip 848, wherein clip 848 has an end bonded to drain contact 20 through a bonding agent such as, for example, solder 144 and an end bonded to electrically conductive interconnect 830 through bonding agent 144. FIG. 54 shows drain contact 20 of semiconductor chip 10.

Gate bond pads 36 and 38 of semiconductor chip 30 are bonded to interconnect extensions 822 and 824, respectively, by solder 144, source bond pad 40 is bonded to electrically conductive interconnect 846B through solder 144, and drain bond pad 42 is bonded to a portion of electrically conductive body 832 that serves as a drain contact area by bonding agent 144.

Source bond pad 18 is electrically connected to electrically conductive layer 846A using a bonding agent 144 such as, for example, solder. Gate bond pad 16 is electrically connected to electrically conductive interconnect 821 using a bonding agent such as, for example, solder. Gate lead 808 is electrically connected to electrically conductive interconnect 821 by an electrically conductive clip 838. Source lead 814 is electrically connected to clip 848 by a bond wire 850. Drain contact 20 is electrically connected to electrically conductive interconnect 846B by an electrically conductive clip 848, which clip 848 has an end bonded to electrically conductive electrical interconnect 846B by a bonding agent such as, for example, solder, and an end bonded to drain 20 by a bonding agent such as, for example, solder. Gate bond pad 36, source bond pad 40, and drain bond pad 42 are indicated by broken lines because semiconductor chip 30 is mounted to device receiving structure 806 in a flip-chip configuration and are therefore blocked or hidden from view by the body of semiconductor chip 30.

As those skilled in the art are aware, support 802 including device receiving structures 804 and 806, semiconductor chips 10 and 30, clips 842 and 848, and bond wire 850 may be encapsulated in a protection material such as, for example a mold compound 150. It should be noted that after encapsulation, gate lead 808, Kelvin lead 810, source lead 812, sense lead 814, and drain lead 816 extend from mold compound 150.

Thus, semiconductor component 800 includes a III-N cascode switch in which the substrate of the III-N semiconductor material is electrically floating. Although semiconductor component 800 is shown as having bond pads not formed over active areas of semiconductor chips 10 and 30, this is not a limitation of the present invention. Bond pads may be formed over active areas of semiconductor chip 10, semiconductor chip 30, or both.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component, comprising:
    a support having a first device receiving structure and a second device receiving structure, the first device receiving structure comprising a device receiving area, the second device receiving structure comprising a drain contact area and a first gate interconnect, the support further including a contact extension, the contact extension common to the first device receiving structure and the second device receiving structure, wherein the first gate interconnect is laterally adjacent to and spaced apart from the contact extension;
    a first lead spaced apart from the support;
    a first semiconductor chip having a first surface and a second surface, wherein a first gate bond pad extends from a first portion of the first surface, a source bond pad extends from a second portion of the first surface, and a drain bond pad extends from a third portion of the first surface, the first gate bond pad of the first semiconductor chip coupled to the first gate interconnect of the second device receiving structure, the drain bond pad coupled to the drain contact area of the second device receiving structure, and the source bond pad of the first semiconductor chip coupled to the contact extension, and wherein the first semiconductor chip is configured from a III-N semiconductor material and coupled to the support in a flip-chip configuration;
    a second semiconductor chip having a first surface and a second surface, a gate bond pad of the second semiconductor chip extending from a first portion of the first surface of the second semiconductor chip and a source bond pad extends from a second portion of the first surface of the second semiconductor chip, and a drain contact formed from the second surface of the second semiconductor chip, the second semiconductor chip coupled to the first device receiving structure, the second semiconductor chip configured from a silicon semiconductor material;
    a first electrical interconnect coupled between the gate bond pad of the first semiconductor device and the source bond pad of the second semiconductor chip; and
    a second electrical interconnect coupled between the gate bond pad of the second semiconductor chip and the first lead.

2. The semiconductor component of claim 1, wherein the first semiconductor chip comprises a gallium nitride semiconductor material.

3. The semiconductor component of claim 1, further including a second lead spaced apart from the support and a third electrical interconnect coupled between the source bond pad of the second semiconductor chip and the second lead.

4. The semiconductor component of claim 3, further including a third lead spaced apart from the support and a fourth electrical interconnect coupled between the source bond pad of the second semiconductor chip and the third lead.

5. The semiconductor component of claim 4, further including a fifth electrical interconnect coupled between the second surface of the first semiconductor chip and the contact extension.

6. The semiconductor component of claim 5, wherein the fifth electrical interconnect is one of a bond wire or a clip.

7. The semiconductor component of claim 4, wherein the fourth electrical interconnect is one of a bond wire or a clip.

8. The semiconductor component of claim 1, further including a second gate interconnect, wherein the first semiconductor chip includes a second gate bond pad coupled to the second gate interconnect.

9. The semiconductor component of claim 1, further including a second lead and a third lead, wherein the second lead is electrically isolated from the first device receiving structure and the third lead is integrally formed with the first device receiving structure.

10. The semiconductor component of claim 9, further including a third electrical interconnect coupled between the source bond pad of the second semiconductor chip and the second lead.

11. The semiconductor component of claim 9, wherein the drain contact area comprises a pedestal structure.

12. A semiconductor component, comprising:
    a support having a first device receiving structure and a second device receiving structure, the first device receiving structure comprising a device receiving area and the second device receiving structure comprising a drain contact area and a first gate interconnect, the support further including a contact extension, the contact extension common to the first device receiving structure and the second device receiving structure;
    a first lead spaced apart from the support;
    a first semiconductor chip having a first surface and a second surface, wherein a first gate bond pad extends from a first portion of the first surface, a source bond pad extends from a second portion of the first surface, and a drain bond pad extends from a third portion of the first surface, the gate bond pad of the first semiconductor chip coupled to the first gate interconnect of the first device receiving structure, the drain bond pad coupled to the drain contact area of the second device receiving structure, and the source bond pad of the first semiconductor chip coupled to the contact extension, and wherein the first semiconductor chip is configured from a III-N semiconductor material and coupled to the support in a flip-chip configuration; and
    a second semiconductor chip having a first surface and a second surface, the second semiconductor chip coupled to the first device receiving structure.

13. The semiconductor component of claim 12, wherein the second semiconductor chip comprises a gate bond pad that extends from a first portion of the first surface of the second semiconductor chip and a source bond pad that extends from a second portion of the first surface of the second semiconductor chip, and a drain contact formed from the second surface of the second semiconductor chip, the second semiconductor chip configured from a silicon semiconductor material.

14. The semiconductor component of claim 13, further including a first electrical interconnect coupled between the drain contact of the second semiconductor chip and the contact extension.

15. The semiconductor component of claim 14, further including a second lead and a third lead, wherein the second lead and the third lead are integrally formed with the first device receiving structure.

16. The semiconductor component of claim 15, further including a fourth lead integrally formed with the second device receiving structure.

17. The semiconductor component of claim 15, further including a second electrical interconnect coupled between the drain contact of the second semiconductor chip and the second surface of the first semiconductor chip.

18. The semiconductor component of claim 12, wherein the contact extension is electrically isolated from the device receiving area and the drain contact area.

19. The semiconductor component of claim 18, wherein the first device receiving structure comprises:
a body of electrically conductive material having a first portion and a second portion, the first portion having a surface, wherein the second portion comprises a pedestal structure having a pedestal surface, and wherein the surface of the first portion is in a first plane and the pedestal surface is in a second plane;
a layer of insulating material bonded to the surface of the first portion;
a first layer of electrically conductive material bonded to a first portion of the layer of insulating material;
a second layer of electrically conductive material bonded to a second portion of the layer of insulating material; and
a third layer of electrically conductive material bonded to a third portion of the layer of insulating material.

20. A method for manufacturing a semiconductor component, comprising:
providing a support having a first device receiving structure, a second device receiving structure, and a contact extension that is common to the first device receiving structure and the second device receiving structure;
coupling a first semiconductor chip to the support in a flip-chip configuration, wherein the first semiconductor chip comprises a III-N semiconductor substrate material having a first surface and a second surface, a first bond pad at a first portion of the first surface, a second bond pad at a second portion of the first surface, and a third bond pad at a third portion of the first surface, wherein the first bond pad is bonded to the contact extension and the second bond pad is coupled to the second device receiving structure; and
coupling a second semiconductor chip to the support, wherein the second semiconductor chip comprises a silicon substrate having first surface and a second surface.

* * * * *